United States Patent
Sezi et al.

(10) Patent No.: US 6,806,344 B2
(45) Date of Patent: Oct. 19, 2004

(54) POLY-O-HYDROXAMIDE, POLYBENZOXAZOLE, AND ELECTRONIC COMPONENT INCLUDING A DIELECTRIC HAVING A BARRIER EFFECT AGAINST COPPER DIFFUSION, AND PROCESSES FOR PREPARING POLY-O-HYDROXYAMIDES, POLYBENZOXAZOLES, AND ELECTRONIC COMPONENTS

(75) Inventors: Recai Sezi, Röttenbach (DE); Andreas Walter, Egloffstein (DE); Anna Maltenberger, Leutenbach (DE); Klaus Lowack, Erlangen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/609,460

(22) Filed: Jun. 27, 2003

(65) Prior Publication Data

US 2004/0063895 A1 Apr. 1, 2004

(30) Foreign Application Priority Data

Jun. 27, 2002 (DE) .......................................... 102 28 770

(51) Int. Cl.⁷ .............................................. C08G 73/22
(52) U.S. Cl. ........................ 528/176; 528/272; 528/288; 528/332; 528/480; 528/503; 257/750
(58) Field of Search ................................. 528/176, 272, 528/288, 332, 480, 503; 257/750

(56) References Cited

U.S. PATENT DOCUMENTS

| | | | |
|---|---|---|---|
| 4,339,521 A | 7/1982 | Ahne et al. | |
| 4,611,053 A | 9/1986 | Sasa | |
| 5,973,202 A | 10/1999 | Sezi et al. | |
| 6,531,632 B2 | 3/2003 | Haussmann et al. | |
| 2002/0010370 A1 | 1/2002 | Haussmann et al. | |
| 2002/0086968 A1 | 7/2002 | Haussmann et al. | |

FOREIGN PATENT DOCUMENTS

| | | |
|---|---|---|
| JP | 2002 174 609 A | 6/2002 |
| WO | 91/09081 | 6/1991 |
| WO | 91/09087 | 6/1991 |
| WO | 97/10193 | 3/1997 |

*Primary Examiner*—Duc Truong
(74) *Attorney, Agent, or Firm*—Laurence A. Greenberg; Werner H. Stemer; Ralph E. Locher

(57) ABSTRACT

Novel poly-o-hydroxyamides can be cyclized to give polybenzoxazoles which have a good diffusion barrier effect with respect to metals. The poly-o-hydroxyamides can be applied to a semiconductor substrate by customary techniques and converted into the polybenzoxazole in a simple manner by heating. This results in a good barrier layer with respect to diffusion of metals. This allows the diffusion barrier between conductor track and dielectric to be substantially dispensed.

15 Claims, 1 Drawing Sheet

POLY-O-HYDROXAMIDE, POLYBENZOXAZOLE, AND ELECTRONIC COMPONENT INCLUDING A DIELECTRIC HAVING A BARRIER EFFECT AGAINST COPPER DIFFUSION, AND PROCESSES FOR PREPARING POLY-O-HYDROXYAMIDES, POLYBENZOXAZOLES, AND ELECTRONIC COMPONENTS

BACKGROUND OF THE INVENTION

FIELD OF THE INVENTION

The invention relates to poly-o-hydroxyamide, polybenzoxazole, and electronic component including a dielectric, all having a barrier effect against copper diffusion. In addition, the invention relates to processes for preparing poly-o-hydroxyamides, polybenzoxazoles, and electronic components.

In order to avoid an inductive disturbance of signals that is caused by capacitive coupling, conductor tracks adjacent one another in microchips are insulated from one another by a dielectric disposed between the conductor tracks. Compounds that are to be used as a dielectric must meet various requirements. Thus, the signal transit time in microchips depends both on the material of the conductor track and on the dielectric that is disposed between the conductor tracks. The lower the dielectric constant of the dielectric, the shorter, too, is the signal transit time. The silica-based dielectrics used to date have a dielectric constant of about four (4).

These materials are gradually being replaced by organic dielectrics that have a substantially lower dielectric constant. The dielectric constant of these materials is generally below three (3).

In the microchips customary at present, the conductor tracks preferably include aluminum, AlCu, or AlCuSi. With increasing integration density of the memory chips, there is a changeover to copper as conductor track material, owing to its lower electrical resistance compared to aluminum. Copper permits shorter signal transit times and hence a reduction in the conductor track cross section. In contrast to the techniques customary to date, in which the dielectric is filled in the trenches between the conductor tracks, in the copper damascene technique, the dielectric is first structured. The resulting trenches are first filled with copper and then excess copper is mechanically ground away. The dielectric must therefore be stable to the materials used for grinding and must have sufficient adhesion to the substrate in order to avoid becoming detached during the mechanical grinding process. Furthermore, the dielectrics must also have sufficient stability in the subsequent process steps in which further components of the microchips are produced. For this purpose, they must have, for example, sufficient thermal stability and must not undergo decomposition even at temperatures of more than 400° C. Moreover, the dielectrics must be stable to process chemicals, such as solvents, strippers, bases, acids or aggressive gases. Further requirements are good solubility and a sufficient shelf life of the precursors from which the dielectrics are produced.

In order to be suitable as a dielectric for microchips, it is very important that the metal of the conductor tracks does not diffuse into the dielectric even at elevated temperature. The production of microchips includes the production stages that cause a thermal load reaching 400° C. or higher, such as, for example, oxide deposition, copper annealing, or tungsten deposition from the gas phase. In order to avoid diffusion of the metal into the dielectric, a barrier is provided between dielectric and metal. Such barriers include, for example, titanium nitride, silicon nitride, silicon carbide, or tantalum nitride. The barrier acts neither as a good dielectric nor as a good conductor. However, it requires space since a certain layer thickness of the barrier is required in order effectively to suppress diffusion of the metal into the dielectric. With increasing integration density, i.e. decreasing width of the conductor tracks, the proportion of space that is occupied by the barrier increases substantially relative to the width of the conductor track. In the case of a conductor track width of 100 nm or less, the barrier may optionally occupy up to 10% of the available width. Therefore, further miniaturization of the semiconductor components is made more difficult. For further miniaturization of the microchips, the width of the barrier must therefore be further reduced or, most preferably, the barrier should be completely dispensed with.

Polybenzoxazoles (PBOs) are polymers that have very high heat resistance. The substances are already used for the production of protective and insulating layers in microchips. Polybenzoxazoles can be prepared by cyclization of poly-o-hydroxyamides. The poly-o-hydroxyamides have good solubility in organic solvents and good film formation properties. They can be applied to electronic components in a simple manner by the spin-coating technique. In a thermal treatment in which the poly-o-hydroxyamide is cyclized to give the polybenzoxazole, a polymer that has the desired properties is obtained. Polybenzoxazoles can also be processed directly in their cyclized form. In this case, however, there are as a rule difficulties with the solubility of the polymer. Building blocks for poly-o-hydroxyamides are described, for example, in DE 100 11 608, which corresponds to U.S. Pat. No. 6,531,632.

Further insulation materials stable at high temperatures are disclosed, for example, in International PCT Publication Nos. WO 97/10193, WO 91/09081, and WO 91/09087 and European Patent Nos. EP 23 662 and EP 264 678. In the case of these materials, however, a barrier must be provided between conductor track and dielectric in order to avoid diffusion of the metal into the dielectric at high temperatures.

SUMMARY OF THE INVENTION

It is accordingly an object of the invention to provide a poly-o-hydroxyamide, a polybenzoxazole, and an electronic component including a dielectric having a barrier effect against copper diffusion, and processes for preparing poly-o-hydroxyamides, polybenzoxazoles, and electronic components that overcome the hereinafore-mentioned disadvantages of the heretofore-known devices of this general type and that involve a polymer that is stable at high temperatures for use in microchips. The polymer permits the production of finer conductor tracks in microchips.

With the foregoing and other objects in view, there is provided, in accordance with the invention, a poly-o-hydroxyamide of the formula I

FORMULA I $$A\left(\overset{O}{\underset{}{C}}-Y^1-\overset{O}{\underset{}{C}}\right)_a\left(\underset{H}{N}-\underset{\underset{OR^1}{|}}{\overset{\overset{OR^1}{|}}{Z^1}}-\underset{H}{N}-\overset{O}{\underset{}{C}}-Y^2-\overset{O}{\underset{}{C}}\right)_b\left(\underset{H}{N}-\underset{\underset{OR^1}{|}}{\overset{\overset{OR^1}{|}}{Z^2}}-\underset{H}{N}-\overset{O}{\underset{}{C}}-Y^3-\overset{O}{\underset{}{C}}\right)_c\left(\underset{H}{N}-\underset{\underset{OR^1}{|}}{\overset{\overset{OR^1}{|}}{Z^3}}-\underset{H}{N}\right)_d A$$

in which:

$Y^2$ is $Y^1$ and $Y^3$, in each case independently of one another, and are selected from -continued
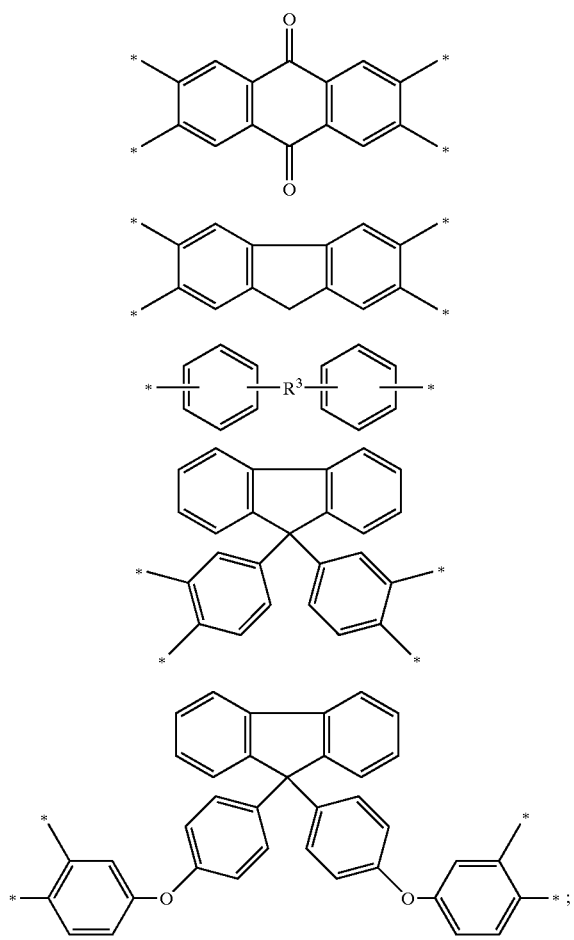
A, if a=0 and/or d=1, is
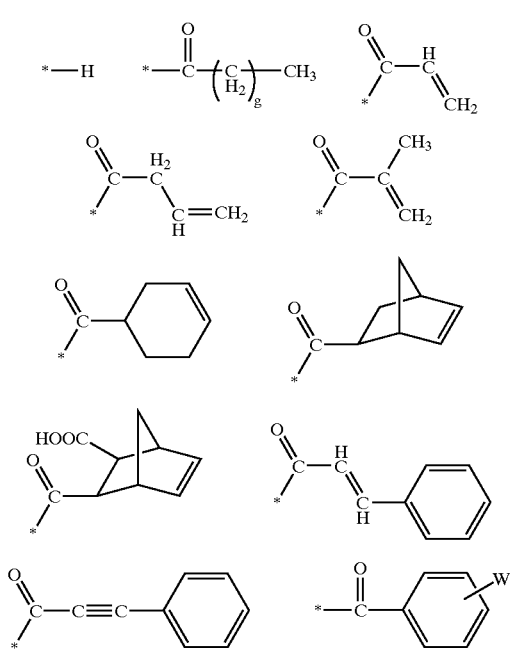
-continued
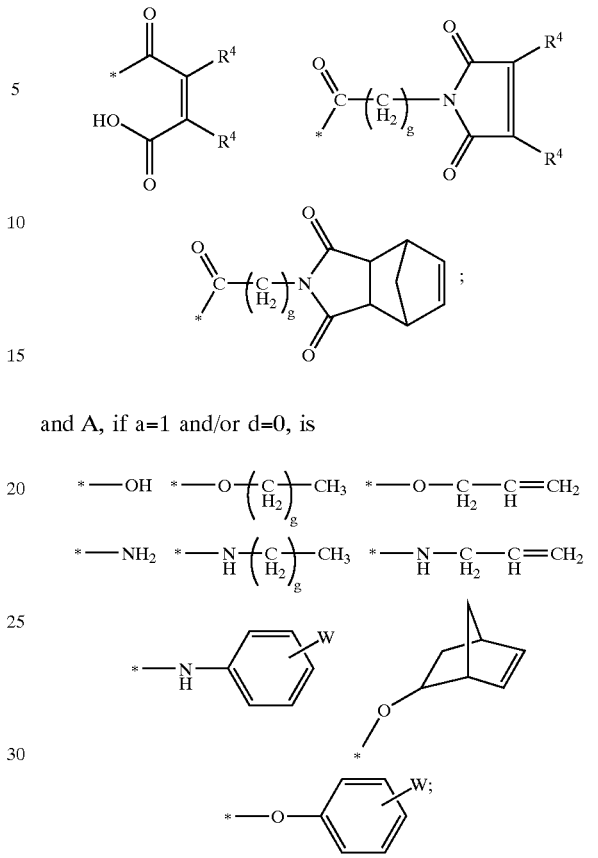
and A, if a=1 and/or d=0, is
E is
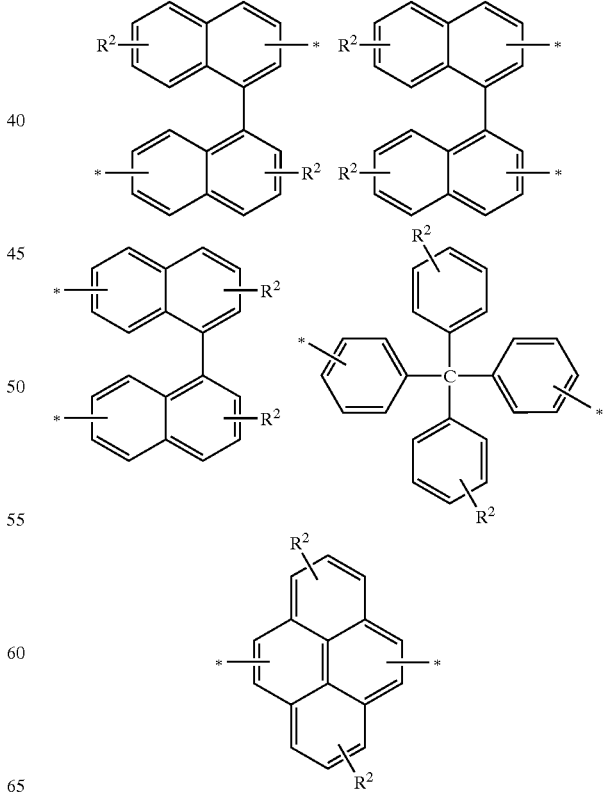

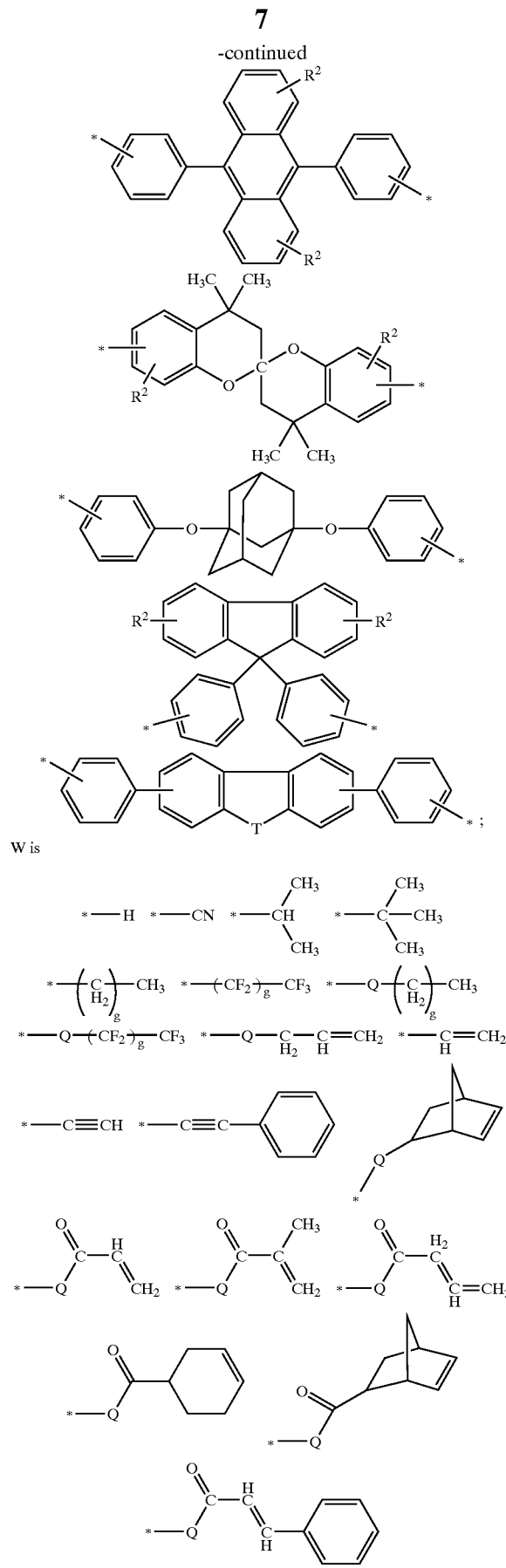
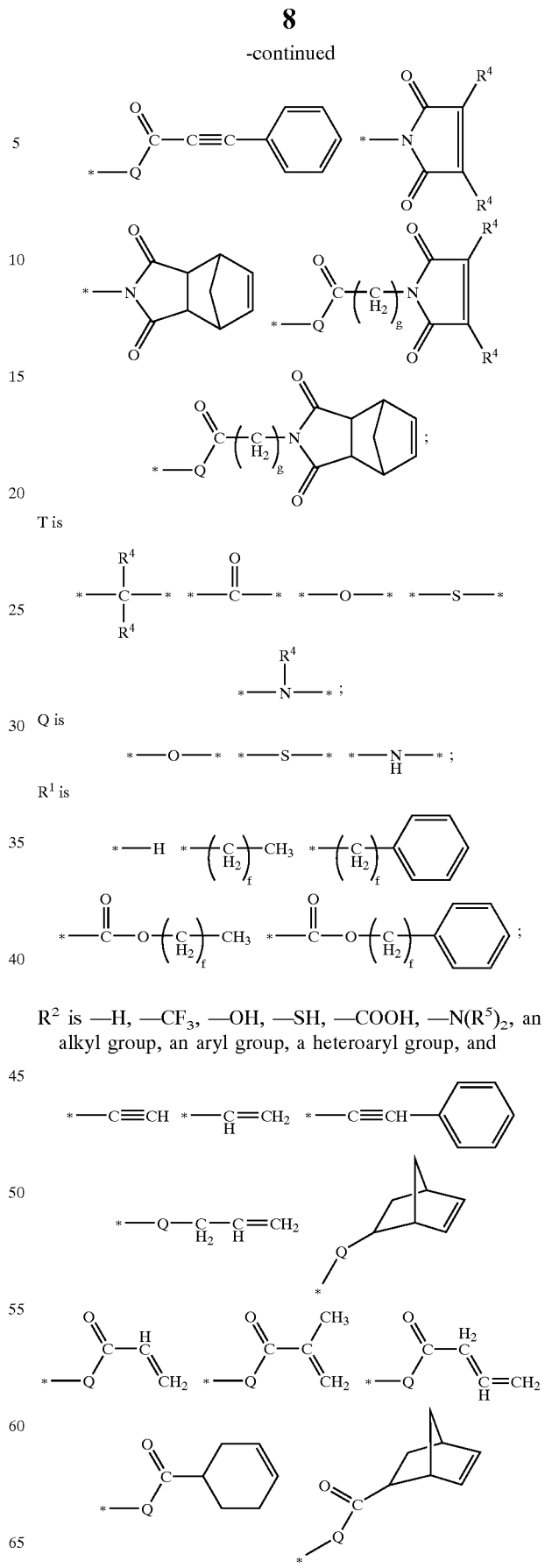

-continued

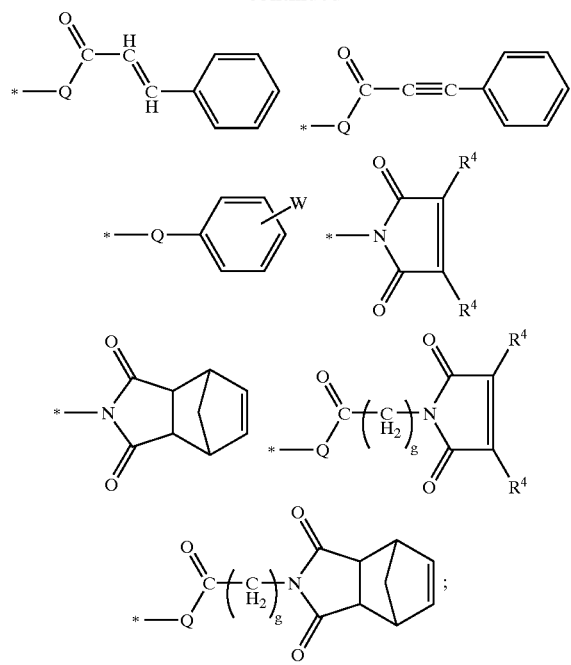

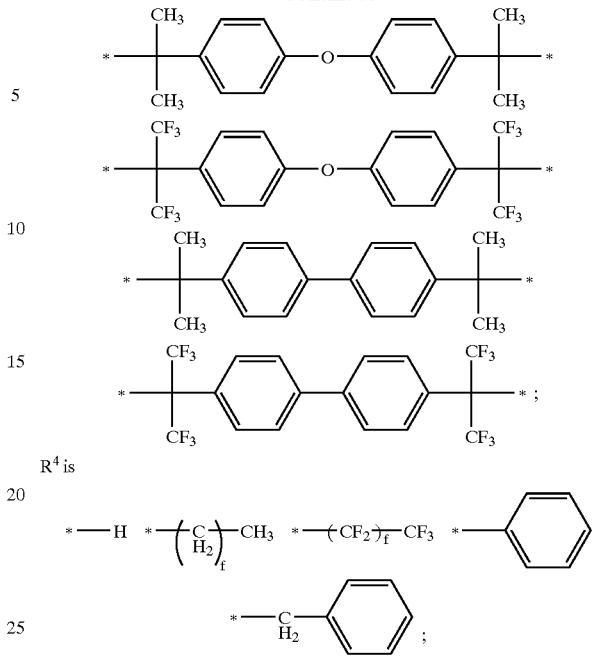

$R^4$ is

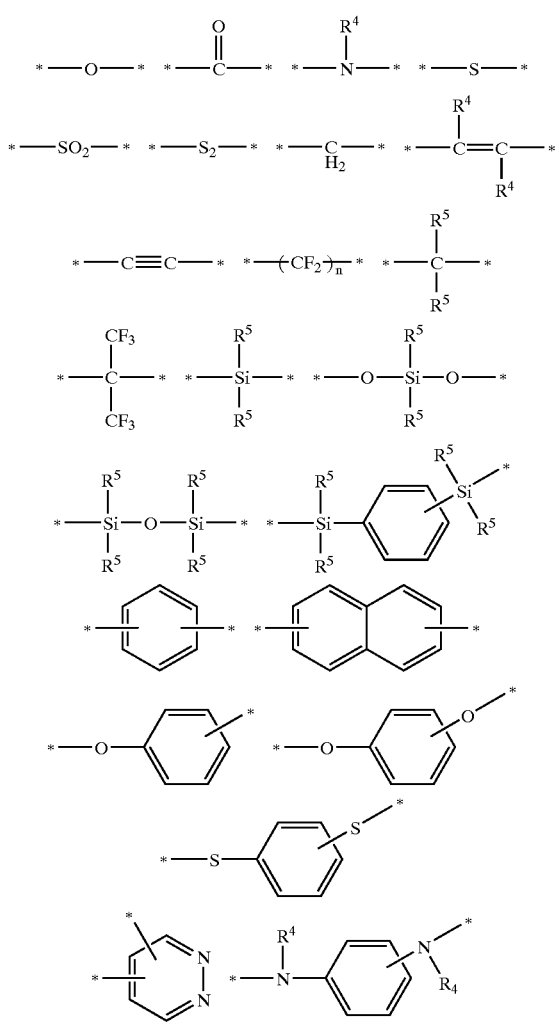

$R^5$ is an alkyl, an aryl or a heteroaryl radical;
a is 0 or 1;
b is 1–200;
c is 0–200;
d is 0 or 1;
e is 0–10;
f is 0–10;
g is 0–10;
h is 1–10;
n is 0 or 1; and
x is 0–10 if $R^3$ is —$CH_2$—.

The poly-o-hydroxyamides of the formula I dissolve in many organic solvents, such as, for example, acetone, cyclohexanone, diethylene glycol mono- or diethyl ether, N-methylpyrrolidone, γ-butyrolactone, ethyl lactate, methoxypropyl acetate, tetrahydrofuran, or ethyl acetate.

They can be applied to a substrate very readily in a uniform film by spin-coating, spraying, or dipping techniques. The evaporation of the solvent gives a homogeneous film that has a uniform layer thickness and complete fills even trenches and contact holes with a high aspect ratio. The poly-o-hydroxyamides of the formula I can be cyclized by heating to give the corresponding polybenzoxazoles; no bubble formation or cracking is observed. Even at high process temperatures of 400° C. or higher, no, or at least only very little, diffusion of metal from the conductor tracks into adjacent regions of the dielectric is observed. The barrier usually disposed between conductor track and dielectric can therefore either be made very thin or even completely dispensed with.

The repeating units characterized in the formula I by the indices b and c can, if c is >0, be randomly distributed in the polymer strand. However, it is also possible to prepare the poly-o-hydroxyamide of the formula I by block copolymerization so that segments of the polymer are composed in each case only of one of the repeating units denoted by the indices b and c. The chain length of the poly-o-hydroxyamides of the formula I can be controlled by the stoichiometric ratios of the starting materials and the reaction conditions, for example the reaction temperature, dilution or rate of addition of the individual components. However, the polymer does of course have a molecular weight distribution, i.e. in each case, mixtures of polymers having a different molecular weight and hence different values for the indices a, b, c, and d may be present. In the preparation of poly-o-hydroxyamides of the formula I, the reaction is preferably carried out in such a way that a narrow molecular weight distribution is achieved. The maximum of the molecular weight distribution is established so that it lies within the ranges characterized by the indices a to d. Within the molecular weight distribution, preferably at least 90% of the polymers are within the limits specified by the indices a to d. The molecular weight of the poly-o-hydroxyamides of the formula I can be determined by customary methods, for example gel permeation chromatography.

The substitution pattern of the groups $Z^1$, $Z^2$, and $Z^3$ is chosen so that in each case a pair formed from an —NH group and an $OR^1$ group are disposed in the ortho position to one another. This is necessary in order to permit cyclization to an oxazole ring in the cyclization of the poly-o-hydroxyamides of the formula I. The poly-o-hydroxyamides of the formula I may carry a terminal group A that, after the polymerization, is introduced into the polymer as a terminal group via a corresponding activated compound. Suitable compounds are, for example, acid chlorides, alkyl halides, or alcohols. The precursor required for introduction of the terminal group A is chosen according to the group that the polymer carries as a terminal group after the polymerization. If the index a=0 or the index d=1, the terminal group A is bonded to an NH group. A suitable activated precursor is then, for example, an acid chloride. If the index a=1 or the index d=0, the terminal group A is bonded to a CO group. Suitable reagents for introducing the terminal group A are then, for example, halides, alcohols, or amines.

If the group $R^2$ is an alkyl group, this preferably includes 1 to 10 carbon atoms. The alkyl group may be linear or branched. Suitable groups are, for example, a methyl group, an ethyl group, a propyl group, or an isopropyl group. If $R^2$ is an aryl group, this preferably includes 6 to 20 carbon atoms, it also is possible for the aromatic system to be substituted by alkyl groups. Examples of suitable groups are the phenyl group, the methylphenyl group or the naphthyl group. If $R^2$ is a heteroaryl group, this preferably includes 4 to 20 carbon atoms and 1 to 4 heteroatoms. Suitable heteroatoms are, for example, nitrogen, oxygen, or sulfur.

If $R^5$ is an alkyl group, this may be linear or branched and preferably includes 1 to 10 carbon atoms. If $R^5$ is an aryl group, this preferably includes 6 to 20 carbon atoms, the aromatic system preferably being formed by 6-membered rings. If $R^5$ is a heteroaryl group, this preferably includes 4 to 10 carbon atoms and 1 to 4 heteroatoms. Here too, suitable heteroatoms are nitrogen, oxygen, or sulfur.

The film quality of the film produced with the poly-o-hydroxyamide of the formula I is influenced, inter alia, by the chain length of the polymer. Particularly preferably, the poly-o-hydroxyamide of the formula I has a composition such that the index b assumes values between 5 and 50 and the index c values between 0 and 50. In a particular embodiment, the index c assumes values in the range from 1 to 50. In a preferred embodiment, the poly-o-hydroxyamide of the formula I includes ether bridges. In this case, the index n in the structural element $Y^2$ assumes the value 2.

The polybenzoxazoles produced from the poly-o-hydroxyamide of the formula I have a dielectric constant of less than 3. If the dielectric constant is to be even further reduced, pores are provided in the polybenzoxazole. For this purpose, the poly-o-hydroxyamide of the formula I may include further repeating units that are thermally labile and liberate a gas with decomposition on heating. The gas can diffuse out of the polybenzoxazole so that a cavity is formed in the polybenzoxazole.

The thermally labile repeating unit is preferably provided as a block in the poly-o-hydroxyamide. This can be achieved, for example, by first preparing oligomers from the thermally labile repeating units and then reacting these with the poly-o-hydroxyamide of the formula I. However, it is also possible first to prepare a poly-o-hydroxyamide of the formula I by polymerization and then to graft the thermally labile repeating units onto the poly-o-hydroxyamide in a further polymerization reaction. The decomposition temperature of the thermally labile repeating units should be chosen so that it is below the glass transition temperature of the poly-o-hydroxyamide of the formula I. Suitable repeating units by which the poly-o-hydroxyamide of the formula I can be supplemented in order to obtain a thermally labile copolymer are derived, for example, from polypropylene oxide, polymethyl methacrylate, and aliphatic polycarbonates, such as, for example, polypropylene carbonate and polyethylene carbonate. In addition to the thermally labile repeating units, other repeating units may also be used if they eliminate a gaseous product on heating. The proportion of the thermally labile repeating units in the copolymer is preferably chosen to be between 5 and 60% by weight of the copolymer. Such copolymers are described, for example, in U.S. Pat. No. 5,776,990 to Hedrick et al.

Pore formation can also be achieved by adding to the poly-o-hydroxyamide of the formula I a suitable porogen that decomposes on heating, gaseous products being liberated. Suitable porogens are, for example, citric acid, malic acid, or malonic acid.

As already mentioned, the polybenzoxazoles obtained from the poly-o-hydroxyamides of the formula I by cyclization have advantageous properties. The adhesion of the polybenzoxazole prepared from the poly-o-hydroxyamide of the formula I to surfaces relevant for microchip technology, such as silicon, silicon carbide, silicon carbonitride, silicon nitride, silica, titanium, tantalum, titanium nitride, tantalum nitride or silicon oxynitride, is very good. Furthermore, the polybenzoxazoles have high resistance to chemicals as used in the production of microchips, such as solvents, strippers, bases, acids or aggressive gases. The polymer materials are therefore very suitable for microelectronic applications. In addition, the materials are also outstandingly suitable for the copper damascene technique. During the copper grinding process, no disadvantageous effects occur, such as delamination, cracking or bubble formation. The polybenzoxazoles according to the invention surprisingly inhibit the diffusion in the dielectric. In addition to the electrical insulation function, they can therefore also be used as a diffusion barrier for copper. It is therefore possible to dispense with a barrier between dielectric and conductor track, or the barrier can be made substantially thinner. As a result of the smaller amount of space required, this permits an increase in the integration density. If the barrier can be completely dispensed with, the use of the polybenzoxazoles according to the invention furthermore results in a reduction in the production costs of the microchips since the step for the production of the barrier is omitted.

The poly-o-hydroxyamides of the formula I are prepared from bis-o-aminophenols and dicarboxylic acids or their derivatives. The invention therefore also relates to a process for the preparation of poly-o-hydroxyamides of the formula I, at least one monomer of the formula II

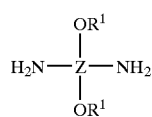

Formula II in which Z is $Z^1$, $Z^2$, or $Z^3$, and $Z^1$, $Z^2$, $Z^3$, and $R^1$ have the abovementioned meaning,
being reacted with at least one dicarboxylic acid or one activated dicarboxylic acid derivative of the formula III

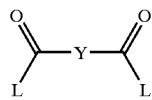

Formula III in which L is a hydroxyl group or an activating group and Y is $Y^1$, $Y^2$, or $Y^3$, and $Y^1$, $Y^2$, and $Y^3$ have the abovementioned meaning.

For example, acid chlorides or activated esters, for example sulfonic esters, can be used as an activating group for the dicarboxylic acid derivatives of the formula III. The reaction of the monomers of the formula II and the dicarboxylic acids of the formula III can, however, also be effected in the presence of a compound which activates the dicarboxylic acid, such as, for example, carbonyldiimidazole or dicyclohexyl-carbodiimide. In principle, all reagents that bind the water formed in the reaction to themselves are suitable. For the preparation of the poly-o-hydroxyamides of the formula I, the monomers of the formula II and dicarboxylic acids or optionally the dicarboxylic acid derivatives of the formula III are reacted in an organic solvent at from −20 to 150° C. in the course of from 5 to 20 hours. If required, terminal groups of the polymer can be blocked by a suitable reagent in order thus to introduce the terminal groups A. Suitable reagents have already been described in the explanation of the compound of the formula I. The poly-o-hydroxyamide of the formula I that is formed after the reaction is precipitated by dropwise addition of the reaction solution to a precipitating agent, washed and dried. Suitable precipitating agents are water and alcohols, such as isopropanol, butanol, or ethanol. Mixtures of these precipitating agents may also be used. The precipitating agent may suitably also contain from 0.1% to 10% of ammonia. After filtration and drying, the precipitated polymer can be directly further processed and, for example, dissolved in one of the solvents mentioned further above, for application to a semiconductor substrate.

The polymerization to give poly-o-hydroxyamide of the formula I can be carried out in the presence of a base in order to trap liberated acid. Suitable basic acid acceptors are, for example, pyridine, triethylamine, diazabicyclooctane, or polyvinylpyridine. However, it is also possible to use other basic acid acceptors. Compounds that are readily soluble in the solvent used for the synthesis, such as, for example, N-methylpyrrolidone, and in the precipitating agent, for example water or water/alcohol mixtures, or those that are completely insoluble in the solvent, such as, for example, crosslinked polyvinylpyridine, are particularly preferred. The acid acceptors can then be readily separated from the resulting poly-o-hydroxyamide of the formula I during the working-up of the reaction product.

Particularly suitable solvents for the polymer synthesis are γ-butyrolactone, tetrahydrofuran, N-methylpyrrolidone, and dimethylacetamide. However, any solvent in which the starting components are readily soluble can in principle be used.

In accordance with a further object of the invention, the invention relates to a process for the preparation of the polybenzoxazoles described, poly-o-hydroxyamides of the formula I being heated. Heating results in the formation of an oxazole ring with elimination of a small molecule, in general water, the polybenzoxazoles according to the invention being obtained. The mechanism taking place during the cyclization of the poly-o-hydroxyamides of the formula I to polybenzoxazoles is shown schematically below:

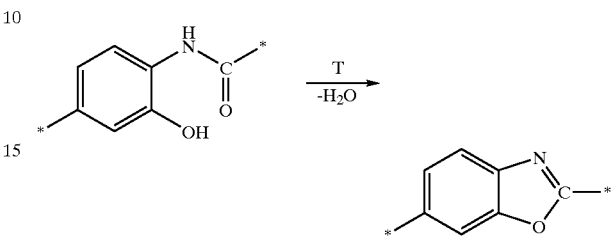

On heating, the o-hydroxyamide undergoes cyclization to give the oxazole with water being liberated.

The polybenzoxazole prepared by the process according to the invention has a low dielectric constant of $k \leq 3.0$ and adheres very well to the surfaces relevant for chip technology, such as silicon, silicon carbide, silicon carbonitride, silicon nitride, silica, titanium, tantalum, titanium nitride, tantalum nitride, or silicon oxynitride.

The invention therefore also relates to an electronic component that contains the polybenzoxazole described above. The polybenzoxazole can be disposed, for example, as a dielectric between conductor tracks or conductor track planes or as a buffer layer between microchip and a housing surrounding this.

The dielectrics according to the invention are outstandingly suitable for the copper damascene technique. During the grinding process, no disadvantageous effects occur, such as delamination, cracking or bubble formation.

Therefore, the invention also relates to a process for the production of an electronic component. A solution of the poly-o-hydroxyamide of the formula I in a solvent is first prepared. The solution is applied to a substrate and the solvent is evaporated so that a film is obtained. The film is then heated in order to cyclize the poly-o-hydroxyamide and to convert it into the polybenzoxazole of the formula III. The film is then structured in order to obtain a resist structure which has trenches and/or contact holes. A conductive material, for example copper, is then deposited on the resist structure so that trenches and/or contact holes are filled with the conductive material. Finally, excess conductive material is removed, for example by chemical mechanical planarization (CMP).

For example, lithographic methods can be used for structuring the polybenzoxazole film, an etch-resistant mask being produced on the film. The structure of the mask is then transferred to the film from the polybenzoxazole according to the invention by etching. The conductive material used is preferably copper. A barrier can be provided between dielectric and conductive material. For example, the materials already mentioned further above are suitable as material for the barrier. The microchip is then completed in a customary manner.

Furthermore, the invention relates to a process for the production of an electronic component. First, a solution of a poly-o-hydroxyamide of the formula I described above in a solvent first is prepared. The solution is then applied to a substrate that already has on its surface metallic structures between which trenches are formed. Such structures are, for example, conductor tracks. The solvent is evaporated so that the trenches are filled with the poly-o-hydroxyamide of the formula I. Lastly, the substrate is heated in order to cyclize the poly-o-hydroxyamide of the formula I to the polybenzoxazole. The microchip is then completed in a customary manner.

The adhesion of the poly-o-hydroxyamides of the formula I to surfaces relevant in microelectronics, such as, for example, silicon, silica, silicon nitride, tantalum nitride, glass or quartz, can be improved by adding adhesion promoters.

Other features that are considered as characteristic for the invention are set forth in the appended claims.

Although the invention is illustrated and described herein as embodied in a poly-o-hydroxyamide, a polybenzoxazole, and an electronic component including a dielectric having a barrier effect against copper diffusion, and processes for preparing poly-o-hydroxyamides, polybenzoxazoles, and electronic components, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
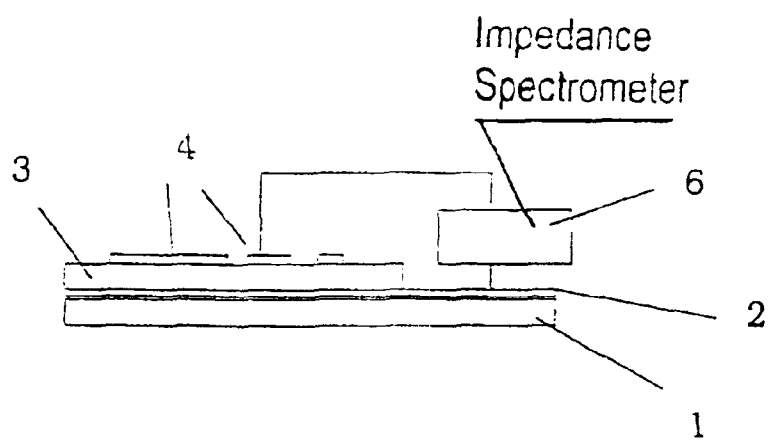
FIG. 1 is a diagrammatic front side view of a test setup for determining the dielectric constant.

The following is a list of the chemicals used.

Bisaminophenols:

9,9-bis(4-((3-hydroxy-4-amino)phenoxy)phenyl)fluorene—(bisaminophenol 1)

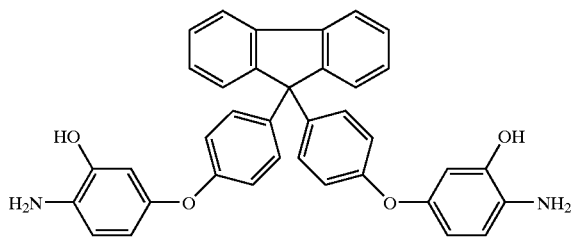

2,2-bis(3-amino-4-hydroxyphenyl)hexafluoropropane—(bisaminophenol 2)

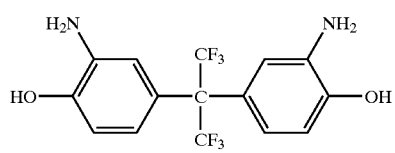

3,3'-diamino-4,4'-dihydroxybiphenyl—(bisaminophenol 3)

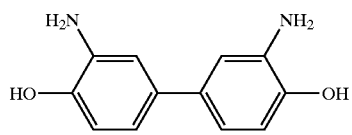

2,2-bis(3-amino-4-hydroxyphenyl)sulfone—(bisaminophenol 4)

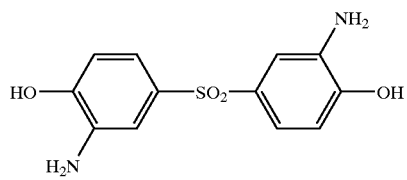

Dicarboxylic Acid Chlorides:

9,9-bis(4-(4-chlorocarbonyl)phenoxy)phenylfluorene—dicarboxylic acid chloride 1

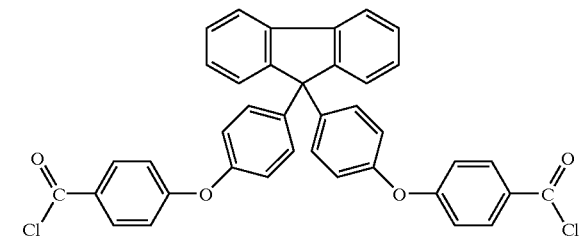

4,4'-di(4-(chlorocarbonyl)phenoxy)tetraphenylmethane—dicarboxylic acid chloride 2

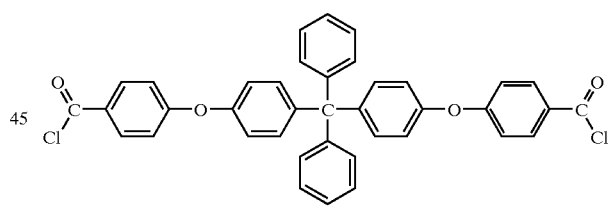

2,2'-di(4-(chlorocarbonyl)phenoxy)-1,1'-binaphthyl—dicarboxylic acid chloride 3

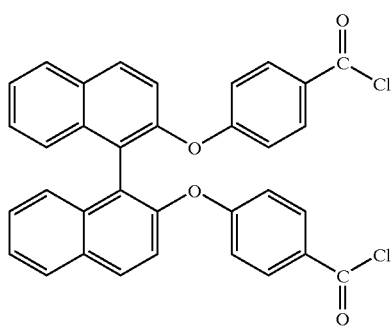

2,7-di-tert-butyl-pyrene-4,9-dicarboxylic acid chloride—(dicarboxylic acid chloride 4)

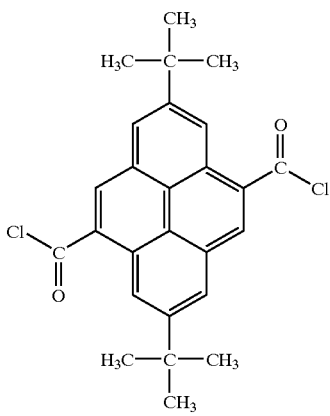

4,4'-di(chlorocarbonyl)diphenyl ether—(dicarboxylic acid chloride 5)

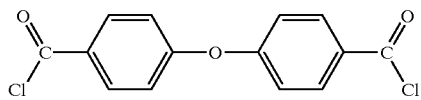

Terephthalic acid dichloride—(dicarboxylic acid chloride 6)

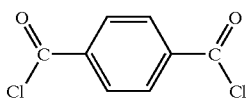

5-Phenylethynylisophthaloyl chloride—(dicarboxylic acid chloride 7)

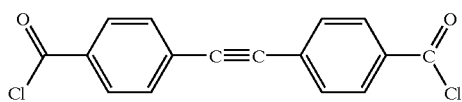

Endcap:

Methacryloyl chloride—(endcap 1)

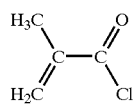

5-Norbornene-2-carboxylic acid chloride—(endcap 2)

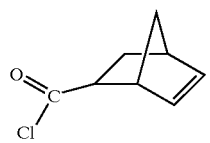

5-Norbornene-2,3-dicarboxylic anhydride—(endcap 3)

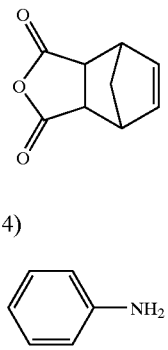

Aniline—(endcap 4)

EXAMPLE 1

Synthesis of Polymer 1

56.42 g (0.1 mol) of bisaminophenol 1 are dissolved in 400 ml of distilled N-methylpyrrolidone (NMP). A solution of 59.48 g (0.095 mol) of dicarboxylic acid chloride 1 in 400 ml of distilled NMP is added dropwise to this solution at 10° C. while stirring. Stirring is continued for a further hour at 10° C. and then for 1 hour at 20° C. After cooling again to 10° C., 1.64 g (0.01 mol) of endcap 3, dissolved in 50 ml of distilled γ-butyrolactone (γ-BL), are added dropwise to the reaction mixture and stirring is effected for 1 hour at 10° C. and then for 1 hour at 20° C. The reaction mixture is cooled to 10° C., after which 19.76 g (0.25 mol) of pyridine, dissolved in 30 ml of distilled γ-BL, are added and the reaction mixture is warmed up to room temperature and stirred for 2 hours.

In order to isolate the polymer, the reaction mixture is filtered and the filtrate is added dropwise to a mixture of 1 l of demineralized water and 200 ml of isopropanol while stirring, a further 3 l of demineralized water being added during the dropwise addition. The precipitated polymer is filtered off by suction and washed with 2 l of cold demineralized water. After being filtered off with suction, the polymer is stirred twice for 1 hour at room temperature in 2.5 l of a 3% strength ammonia solution each time and then filtered off with suction. The polymer is washed neutral with demineralized water, filtered off, and dried for 72 hours at 50° C./10 mbar.

The polymer prepared in this manner is readily soluble in solvents such as NMP, γ-BL, cyclohexanone, cyclopentanone, or mixtures thereof.

EXAMPLE 2

Synthesis of Polymer 2

53.6 g (0.095 mol) of bisaminophenol 1 are dissolved in 400 ml of distilled NMP. A solution of 62.8 g (0.1 mol) of dicarboxylic acid chloride 2 in 400 ml of distilled γ-BL is added dropwise to this solution at 10° C. while stirring. Stirring is continued for a further hour at 10° C. and then for 1 hour at 20° C. After cooling again to 10° C., 0.93 g (0.01 mol) of endcap 4, dissolved in 10 ml of distilled γ-BL, is added dropwise to the reaction mixture and stirred for 1 hour at 10° C. and then for 1 hour at 20° C. The reaction mixture is cooled to 10° C., after which 19.76 g (0.25 mol) of pyridine, dissolved in 80 ml of distilled γ-BL, are added and the reaction mixture is warmed up to room temperature and stirred for 2 hours.

The isolation and working-up of the polymer 2 were effected analogously to example 1.

EXAMPLE 3

Synthesis of Polymer 3

18.3 g (0.05 mol) of bisaminophenol 2 are dissolved in 200 ml of distilled NMP. A solution of 16.86 g (0.03 mol) of dicarboxylic acid chloride 3 and 7.67 g (0.0175 mol) of dicarboxylic acid chloride 4 in 250 ml of distilled γ-BL is added dropwise to this solution at 10° C. while stirring. Stirring is continued for a further hour at 10° C. and then for 1 hour at 20° C. After cooling again to 10° C., 0.52 g (0.005 mol) of endcap 1, dissolved in 20 ml of distilled 7-BL, is added dropwise to the reaction mixture and stirring is effected for 1 hour at 10° C. and then for 1 hour at 20° C. The reaction mixture is cooled to 10° C., after which 9.48 g (0.12 mol) of pyridine, dissolved in 30 ml of distilled ε-BL, are added and the reaction mixture is warmed up to room temperature and stirred for 2 hours.

The isolation and the working-up of the polymer 3 were effected analogously to example 1.

EXAMPLE 4

Synthesis of Polymer 4

34.78 g (0.095 mol) of bisaminophenol 2 are dissolved in 200 ml of distilled NMP. A solution of 31.3 g (0.05 mol) of dicarboxylic acid chloride 1 and 14.7 g (0.05 mol) of dicarboxylic acid chloride 5 in 200 ml of distilled γ-BL is added dropwise to this solution at 10° C. while stirring. Stirring is effected for a further hour at 10° C. and then for 1 hour at 20° C. After cooling to 10° C., 11.85 g (0.15 mol) of pyridine, dissolved in 50 ml of distilled γ-BL, are added to the reaction mixture and it is warmed up to room temperature and stirred for 2 hours.

The isolation and the working-up of the polymer 4 were effected analogously to example 1.

EXAMPLE 5

Synthesis of Polymer 5

10.8 g (0.05 mol) of bisaminophenol 3 are dissolved in 200 ml of distilled NMP. A solution of 12.04 g (0.0275 mol) of dicarboxylic acid chloride 4 in 100 ml of distilled γ-BL is added dropwise to this solution at 10° C. while stirring. Stirring is effected for a further hour at 10° C. and then for 1 hour at 20° C. Cooling is effected to 10° C. and 4.04 g (0.02 mol) of dicarboxylic acid chloride 6, dissolved in 80 ml of distilled γ-BL, are added dropwise. Stirring is effected for a further hour at 10° C. and then for 1 hour at 20° C. After cooling again to 10° C. 0.78 g (0.005 mol) of endcap 2, dissolved in 20 ml of distilled γ-BL, is added dropwise to the reaction mixture and stirring is effected for 1 hour at 10° C. and then for 1 hour at 20° C. The reaction mixture is cooled to 10° C., after which 11.85 g (0.15 mol) of pyridine, dissolved in 50 ml of distilled γ-BL, are added and the reaction mixture is warmed up to room temperature and stirred for 2 hours.

The isolation and working-up of the polymer 5 were effected analogously to example 1.

EXAMPLE 6

Synthesis of Polymer 6

26.6 g (0.095 mol) of bisaminophenol 4 are dissolved in 300 ml of distilled NMP. A solution of 33.72 g (0.06 mol) of dicarboxylic acid chloride 3 in 150 ml of distilled NMP is added dropwise to this solution at 10° C. while stirring. Stirring is effected for a further hour at 10° C. and then for 1 hour at 20° C. Cooling is effected to 10° C. and 12.08 g (0.04 mol) of dicarboxylic acid chloride 7, dissolved in 100 ml of γ-BL, are added dropwise. Stirring is effected for a further hour at 10° C. and then for 1 hour at 20° C. After cooling again to 10° C., 0.93 g (0.01 mol) of endcap 4, dissolved in 10 ml of distilled γ-BL, is added dropwise to the reaction mixture and stirring is effected for 1 hour at 10° C. and then for 1 hour at 20° C. The reaction mixture is cooled to 10° C., after which 19.76 g (0.25 mol) of pyridine, dissolved in 80 ml of distilled γ-BL, are added and the reaction mixture is warmed up to room temperature and stirred for 2 hours.

The isolation and working-up of the polymer 6 were effected analogously to example 1.

EXAMPLE 7

Synthesis of Polymer 7

18.3 g (0.05 mol) of bisaminophenol 2 and 14.0 g (0.05 mol) of bisaminophenol 4 are dissolved in 300 ml of distilled NMP. A solution of 59.48 g (0.095 mol) of dicarboxylic acid chloride 1 in 300 ml of distilled γ-BL is added dropwise to this solution at 10° C. while stirring. Stirring is effected for a further hour at 10° C. and then for 1 hour at 20° C. After cooling again to 10° C., 1.64 g (0.01 mol) of endcap 3, dissolved in 20 ml of distilled γ-BL, are added dropwise to the reaction mixture and stirring is effected for 1 hour at 10° C. and then for 1 hour at 20° C. The reaction mixture is cooled to 10° C., after which 19.76 g (0.25 mol) of pyridine, dissolved in 50 ml of distilled γ-BL, are added and the reaction mixture is warmed up to room temperature and stirred for 2 hours.

The isolation and working-up of the polymer 7 were effected analogously to example 1.

EXAMPLE 8

Synthesis of Polymer 8

21.96 g (0.06 mol) of bisaminophenol 2 and 8.64 g (0.04 mol) of bisaminophenol 3 are dissolved in 300 ml of distilled NMP. A solution of 28.1 g (0.05 mol) of dicarboxylic acid chloride 3 and 13.23 g (0.045 mol) of dicarboxylic acid chloride 5 in 350 ml of distilled γ-BL is added dropwise to this solution at 10° C. while stirring. Stirring is effected for a further hour at 10° C. and then for 1 hour at 20° C. After cooling again to 10° C., 1.56 g (0.01 mol) of endcap 2, dissolved in 50 ml of distilled γ-BL, are added dropwise to the reaction mixture and stirring is effected for 1 hour at 10° C. and then for 1 hour at 20° C. The reaction mixture is cooled to 10° C., after which 19.76 g (0.25 mol) of pyridine, dissolved in 50 ml of distilled γ-BL, are added and the reaction mixture is warmed up to room temperature and stirred for 2 hours.

The isolation and working-up of the polymer 8 were effected analogously to example 1.

EXAMPLE 9

Synthesis of Polymer 9

39.49 g (0.07 mol) of bisaminophenol 1 and 8.4 g (0.03 mol) of bisaminophenol 4 are dissolved in 300 ml of distilled NMP. A solution of 37.56 g (0.06 mol) of dicarboxylic acid chloride 1 and 21.98 g (0.035 mol) of dicarboxylic acid chloride 2 in 350 ml of distilled γ-BL is added dropwise to this solution at 10° C. while stirring. Stirring is effected for a further hour at 10° C. and then for 1 hour at 20° C. After cooling again to 10° C., 1.56 g (0.01 mol) of endcap 2, dissolved in 15 ml of distilled γ-BL, are added dropwise to the reaction mixture and stirring is effected for 1 hour at 10° C. and then for 1 hour at 20° C. The reaction mixture is cooled to 10° C., after which 19.76 g (0.25 mol) of pyridine, dissolved in 80 ml of distilled γ-BL, are added and the reaction mixture is warmed up to room temperature and stirred for 2 hours.

The isolation and working-up of the polymer 9 were effected analogously to example 1.

EXAMPLE 10

Synthesis of Polymer 10

12.96 g (0.06 mol) of bisaminophenol 3 are dissolved in 150 ml of distilled NMP. A solution of 34.43 g (0.055 mol) of dicarboxylic acid chloride 1 in 200 ml of distilled γ-BL is added dropwise to this solution at 10° C. while stirring. Stirring is effected for a further hour at 10° C. and then for 1 hour at 20° C. Cooling is effected to 10° C. and 11.2 g (0.04 mol) of bisaminophenol 4, dissolved in 100 ml of distilled NMP, are added dropwise. Stirring is effected for a further hour at 10° C. and then for 1 hour at 20° C. Cooling is effected again to 10° C. and 11.76 g (0.04 mol) of dicarboxylic acid chloride 5, dissolved in 150 ml of distilled γ-BL, are added dropwise. Stirring is effected for a further hour at 10° C. and then for 1 hour at 20° C. After cooling again to 10° C., 1.04 g (0.01 mol) of endcap 1, dissolved in 20 ml of distilled γ-BL, are added dropwise to the reaction mixture and stirring is effected for 1 hour at 10° C. and then for 1 hour at 20° C. The reaction mixture is cooled to 10° C., after which 19.76 g (0.25 mol) of pyridine, dissolved in 50 ml of distilled γ-BL, are added and the reaction mixture is warmed up to room temperature and stirred for 2 hours.

The isolation and working-up of the polymer 10 were effected analogously to example 1.

EXAMPLE 11

Determination of the Thermal Stabilities

All polymers described have thermal stabilities of >490° C. according to TGA investigations (apparatus: STA 1500 from Rheometric Scientific, heat-up rate: 5 K/min, inert gas: argon). The isothermal mass loss per hour (at 425° C.) is <0.6%.

Thus, the polymers described meet the requirements for the applications stated at the outset.

EXAMPLE 12

Preparation of Polymer Solutions 25 g of the polymers described in examples 1 to 10 are dissolved in 75 g of distilled NMP (VLSI-Selectipur®) or distilled γ-BL (VLSI-Selectipur®). The dissolution process is expediently effected on a shaking apparatus at room temperature. The solution is then filtered under pressure through a 0.2 μm filter into a cleaned, particle-free sample tube. The viscosity of the polymer solution can be changed by varying the dissolved mass of polymer.

EXAMPLE 13

Improvement of the Adhesion by Adhesion Promoter Solutions

By using adhesion promoters, the adhesion of the polymers to surfaces relevant in microelectronics, such as, for example, silicon, silica, silicon nitride, tantalum nitride, glass, or quartz, can be improved.

Adhesion promoters which may be used are, for example, the following compounds:

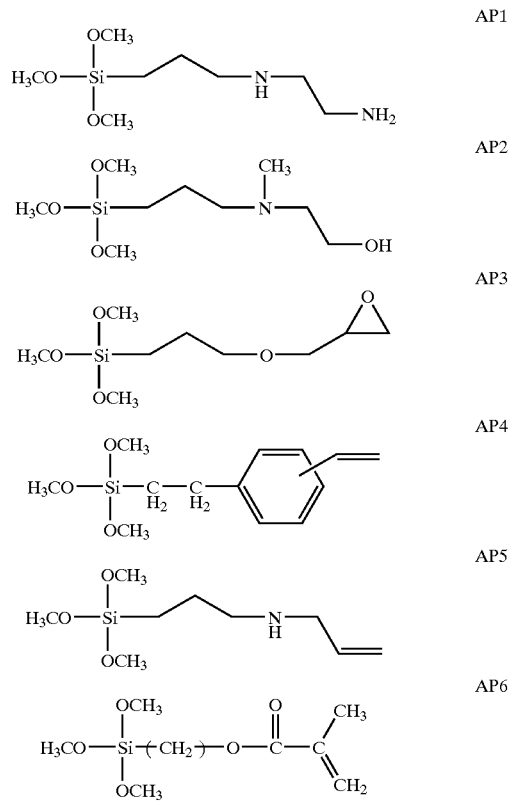

0.5 g of adhesion promoter (e.g. N-(2-aminoethyl)-3-aminopropylmethyldimethoxysilane) is dissolved at room temperature in 95 g of methanol, ethanol, or isopropanol (VLSI-Selectipur®) and 5 g of demineralized water in a cleaned, particle-free sample tube. After standing for 24 h at room temperature, the adhesion promoter solution is ready for use. This solution can be used for at most 3 weeks.

The adhesion promoter should give a monomolecular layer on the surface of the parts to be adhesively bonded. The adhesion promoter can expediently be applied by the spin-coating technique. For this purpose, the adhesion promoter solution is applied via a 0.2 μm prefilter onto the surface to be adhesively bonded and is spun for 30 s at 5 000 rpm. A drying step is then effected for 60 s at 100° C.

EXAMPLE 14

Application of a Polymer by the Spin-Coating Method and Cyclization to Give the Polybenzoxazole A processed silicon wafer that has lands and trenches up to a minimum dimension of, in each case, about 150 nm is coated with the adhesion promoter, as described in example 10. Thereafter, the filtered solution of the polymer that was synthesized according to example 1 is applied to the wafer by using a syringe and is uniformly distributed by using a spin coater. The spin coater speed is 2,000 rpm. The polymer is then heated on a hotplate for 1 min at 120° C. and for 2 min to 200° C. Thereafter, the coated wafer is heated under nitrogen or argon in an oven to 425° C. for 60 min. The polybenzoxazole thus obtained is inert to acids, bases, and organic solvents.

EXAMPLE 15

Determination of the Adhesion of the Polymers to a Titanium Nitride Layer

A 4" silicon wafer is sputtered with a 50 nm thick titanium nitride layer. The abovementioned solution is applied to this wafer by spin-coating for 5 s at 500 rpm and for 25 s at 2,000 rpm. After a short softbake for 1 min at 120° C. on a hotplate, 10 silicon chips measuring 4×4 mm$^2$, which were likewise sputtered on the surface with 50 nm titanium nitride, are pressed onto the polymer film with a force of 2 N. This stack is then heated for 1 h at 425° C. in a nitrogen atmosphere in an oven. After cooling to room temperature, an adhesion test is carried out by using a shear tester, Dage Series 400. The mean value of the force for polymer 1, which was required for shearing off the chips, is 18.07 N/mm$^2$.

EXAMPLE 16

Determination of the Adhesion of the Polymers to a Tantalum Nitride Layer

The test is carried out in exactly the same way as in example 15, except that here the surface of the wafer and of the chips was formed not of titanium nitride but of tantalum nitride. The mean value of the force for polymer 1, which was required for shearing off the chips, is 16.79 N/mm$^2$.

EXAMPLE 17

Determination of the Adhesion of the Polymers to Silicon

The test is carried out in exactly the same way as in example 15, except that here the surface of the wafer and of the chips was formed not of titanium nitride but of silicon. The mean value of the force for polymer 1, which was required for shearing off the Si chips, is 18.85 N/mm$^2$.

EXAMPLE 18

Determination of the Adhesion of the Polymers to a Silicon Nitride Layer

The test is carried out in exactly the same way as in example 15, except that here the surface of the wafer and of the chips was formed not of titanium nitride but of silicon nitride. The mean value of the force for polymer 1, which was required for shearing off the chips, is 17.15 N/mm$^2$.

EXAMPLE 19

Determination of the Adhesion of the Polymers to a Silica Layer

The test is carried out in exactly the same way as in example 15, except that here the surface of the wafer and of the chips was composed of titanium nitride but of silica. The mean value of the force for polymer 1, which was required for shearing off the chips, is 17.83 N/mm$^2$.

EXAMPLE 20

Determination of the Adhesion of the Polymers to a Silicon Carbide Layer

The test is carried out in exactly the same way as in example 15, except that here the surface of the wafer and of the chips was composed not of titanium nitride but of silicon carbide. The mean value of the force for polymer 1, which was required for shearing off the chips, is 17.94 N/mm$^2$.

EXAMPLE 21

Determination of the Adhesion of the Polymers to a Tantalum Layer

The test is carried out in exactly the same way as in example 15, except that here the surface of the wafer and of the chips was formed not of titanium nitride but of tantalum. The mean value of the force for polymer 1, which was required for shearing off the chips, is 16.97 N/mm$^2$.

EXAMPLE 22

Determination of the Adhesion of the Polymers to a Titanium Layer

The test is carried out in exactly the same way as in example 15, except that here the surface of the wafer and of the chips was formed not of titanium nitride but of titanium. The mean value of the force for polymer 1, which was required for shearing off the chips, is 17.52 N/mm$^2$.

EXAMPLE 23

Determination of the Adhesion of the Polymers to a Polyimide Layer

The test is carried out in exactly the same way as in example 15, except that here the surface of the wafer and of the chips was formed not of titanium nitride but of polyimide. The mean value of the force for polymer 1, which was required for shearing off the chips, is 17.61 N/mm$^2$.

EXAMPLE 24

Comparative Example for Adhesion

A polymer which was prepared analogously to example 1 of U.S. Pat. No. 5,077,378 to Mueller et al. is dissolved, as described in example 12, in NMP. Examples 15 to 23 are repeated with this solution. The following mean values are determined:

| | |
|---|---|
| Titanium nitride surface: | 14.71 N/mm$^2$ |
| Tantalum nitride surface: | 15.69 N/mm$^2$ |
| Silicon surface: | 15.21 N/mm$^2$ |
| Silicon nitride surface: | 14.03 N/mm$^2$ |
| Silica surface: | 14.94 N/mm$^2$ |
| Silicon carbide surface: | 13.37 N/mm$^2$ |
| Tantalum surface: | 13.96 N/mm$^2$ |
| Titanium surface: | 14.07 N/mm$^2$ |
| Polyimide surface: | 13.02 N/mm$^2$ |

EXAMPLE 25

Determination of the Chemical Stability to Organic Solvents

The polymer 1 is applied from 20% strength solution (solvent NMP) to three 41" silicon wafers by spin coating, for 5 s at 500 rpm and for 25 s at 2 000 rpm. After a short softbake for 1 min at 120° C. and 2 min at 200° C. on a hotplate, the wafers are heated for 1 h at 400° C. in a nitrogen atmosphere in an oven. After cooling to room temperature, one coated wafer each is heated for 5 h in NMP, in acetone and in toluene to 50° C. Thereafter, the wafers are dried for 60 min at 200° C. in vacuo and the mass difference is determined. No delamination phenomena are observed.

| Mass decrease: | |
|---|---|
| NMP | 1.1% |
| Acetone | 0.6% |
| Toluene | 0.8% |

EXAMPLE 26

Determination of the Chemical Stability to Acids

The polymer 2 is applied from 20% strength solution (solvent NMP) to three 4" silicon wafers by spin coating, for 5 s at 500 rpm and for 25 s at 2 000 rpm. After a short softbake for 1 min at 120° C. and 2 min at 200° C. on a hotplate, the wafers are heated for 1 h at 400° C. in a nitrogen atmosphere in an oven. After cooling to room temperature, one coated wafer each is heated for 5 h in concentrated HCl, in 50% strength sulfuric acid and in acetic acid to 40° C. Thereafter, the wafers are dried for 60 min at 200° C. in vacuo and the mass difference is determined. No delamination phenomena are observed.

| Mass decrease: | |
|---|---|
| Conc. HCl | 0.4% |
| 50% strength $H_2SO_4$ | 0.5% |
| Acetic acid | 0.1% |

EXAMPLE 27

Determination of the Chemical Stability to Bases

The polymer 3 is applied from 20% strength solution (solvent NMP) to three 4" silicon wafers by spin coating, for 5 s at 500 rpm and for 25 s at 2 000 rpm. After a short softbake for 1 min at 120° C. and 2 min at 200° C. on a hotplate, the wafers are heated for 1 h at 400° C. in a nitrogen atmosphere in an oven. After cooling to room temperature, one coated wafer each is heated for 5 h in 50% strength NaOH, in 47% strength KOH and in concentrated ammonia to 40° C. Thereafter, the wafers are dried for 60 min at 200° C. in vacuo and the mass difference is determined. No delamination phenomena are observed.

| Mass decrease: | |
|---|---|
| 50% strength NaOH | 0.9% |
| 47% strength KOH | 1.0% |
| Conc. ammonia | 0.2% |

EXAMPLE 28

Determination of the Dielectric Constant of Polymer 1

Figure 2:
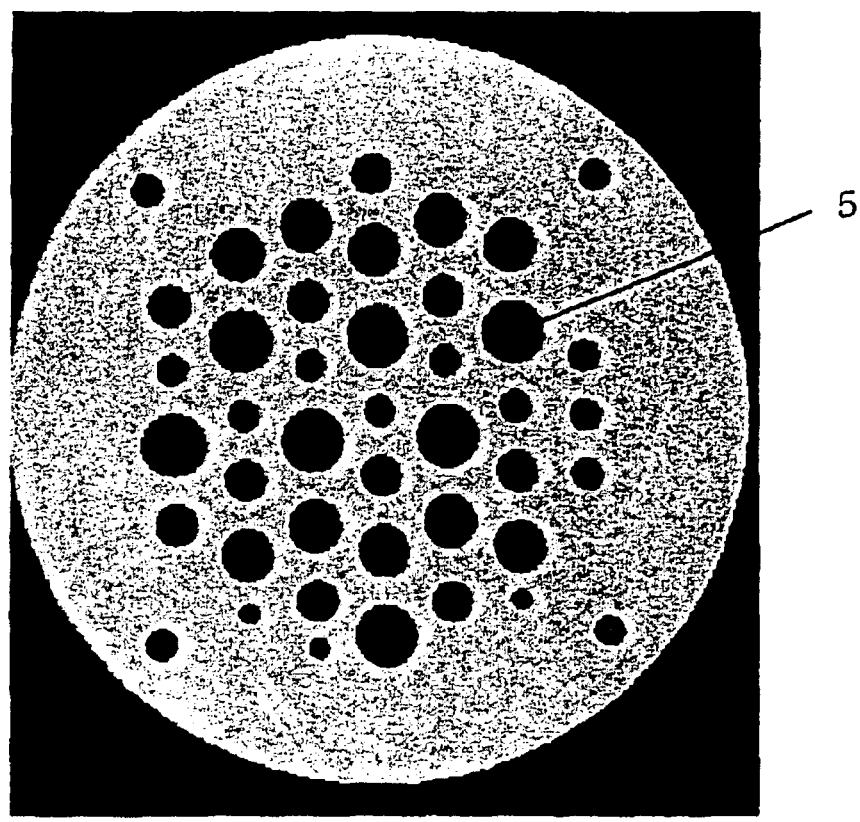
FIG. 2 is a photograph plan view showing a shadow mask for producing electrodes.

The test setup used for determining the dielectric constant is shown in FIG. 1. The polymer 1 is dissolved in NMP (25% strength solution) and the solution is filtered under pressure over a membrane having 0.2 µm pores. This solution is applied by spin coating to a substrate 1 on which a 600 nm thick Ti layer 2 is already present. The layer 3 is dried at 120° C. and 200° C., in each case for 2 min, on a hotplate and then heated at 430° C. for one hour in a nitrogen atmosphere. Titanium electrodes 4 are then applied to this layer 3 by sputtering via a shadow mask shown in FIG. 2. For this purpose, the shadow mask shown in FIG. 2 has apertures 5 formed therein, which correspond in their dimensions and in their configuration to the titanium electrodes 4. The dielectric constant is determined using the impedance spectrometer 6, and is determined as 2.41 in a frequency range from 100 Hz to 1 MHz.

EXAMPLE 29

Determination of the Dielectric Constant of Polymer 2

The determination of the dielectric constant of polymer 2 is effected analogously to example 28 and gives a value of 2.55.

EXAMPLE 30

Determination of the Dielectric Constant of Polymer 3

The determination of the dielectric constant of polymer 3 is effected analogously to example 28 and gives a value of 2.38.

EXAMPLE 31

Determination of the Dielectric Constant of Polymer 4

The determination of the dielectric constant of polymer 4 is effected analogously to example 28 and gives a value of 2.6.

EXAMPLE 32

Determination of the Dielectric Constant of Polymer 8

The determination of the dielectric constant of polymer 10 is effected analogously to example 28 and gives a value of 2.41.

EXAMPLE 33

Comparative Example for Dielectric Constant

A test carried out according to example 28 with a polymer which was prepared analogously to example 1 of U.S. Pat. No. 5,077,378 gives a dielectric constant of 3.1 in the frequency range from 100 Hz to 1 MHz.

EXAMPLE 34

Determination of the Water Absorption

The polymer 1 is applied by spin coating from 20% strength solution (solvent NMP) to a 4" silicon wafer of known mass, for 5 s at 500 rpm and for 25 s at 3 500 rpm. After a short softbake for 1 min at 120° C. on a hotplate, the wafer is heated for 1 h at 400° C. in a nitrogen atmosphere in an oven. The mass of polymer 1 is determined by using an AT261 Delta Range analytical balance.

The coated wafer is then stored for 10 h at 80° C. in water. After the water has been blown off, a further weight determination is carried out. The percentage water absorption, based on the mass of polybenzoxazole, is calculated from the mass difference.

The determined water absorption is 0.75%

EXAMPLE 35

A silicon wafer that was coated first with a Ti—W adhesion-promoting layer (100 nm) and then with copper (500 nm) by sputtering is used for this example.

The solution of polymer 1, which was synthesized according to example 1, is prepared according to example 12, filtered, applied to a wafer (Cu surface) by using a syringe and uniformly distributed by using a spin coater. The polymer is then heated on a hotplate for 1 min at 120° C. and for 2 min to 200° C. The coated wafer is then heated under nitrogen or argon in an oven for 60 min to 425° C. The surface of the polybenzoxazole film obtained in this manner proves to be smooth and clean on microscopic investigation. No copper particles or clusters are detectable on the surface.

The test is repeated with polymers 2 to 10. The result remains the same. Copper diffusion is not detectable in the case of any polymer.

EXAMPLE 36

Comparative Example

The test from example 35 is repeated in exactly the same way, except that this time a polymer from European Patent EP 0264678 (example 1) is used. After heating, the copper which has diffused through is visible on the surface of the resulting polybenzoxazole film.

We claim:
1. A poly-o-hydroxyamide having a formula I

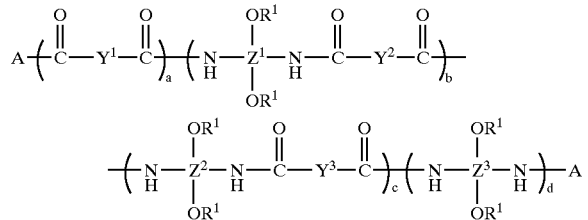

FORMULA I wherein:

$Y^2$ is

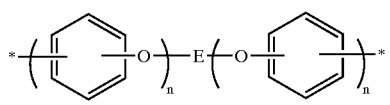

$Y^1$ and $Y^3$, in each case independently of one another, are a substituent selected from the group consisting of:

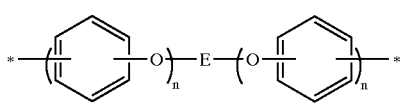

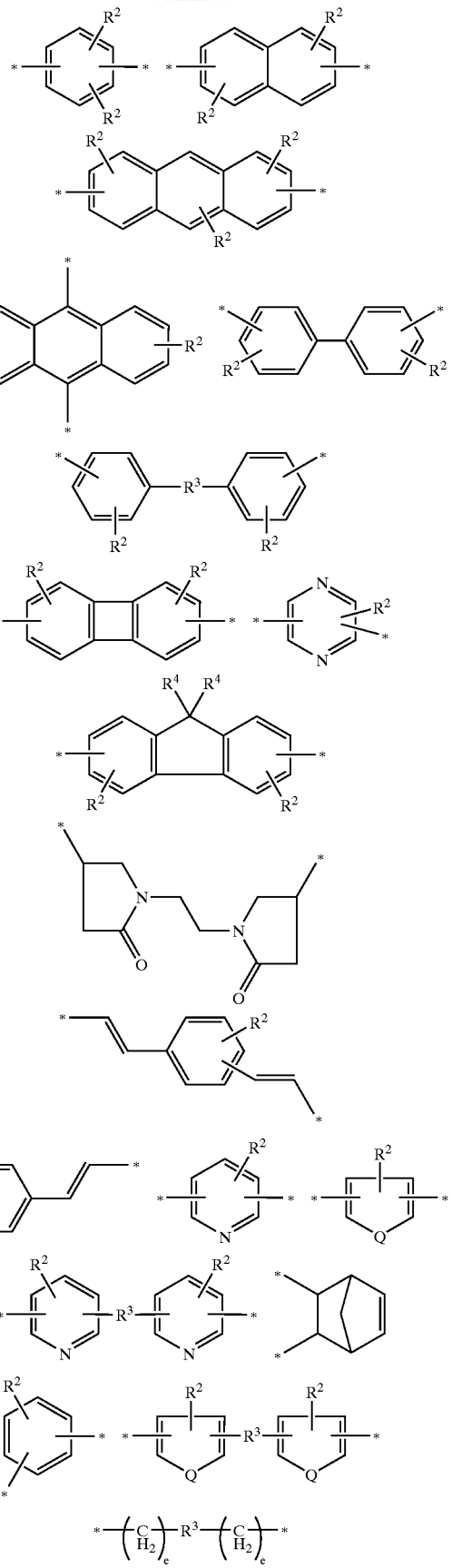

-continued
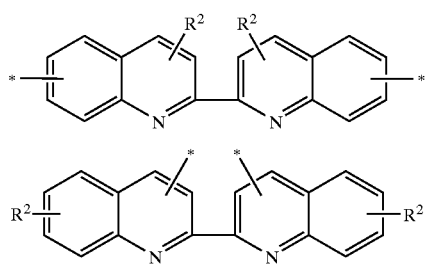
$Z^1$, $Z^2$, and $Z^3$, in each case independently, are substituents selected from the group consisting of:
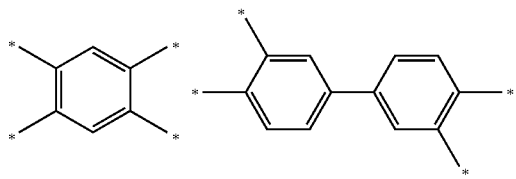
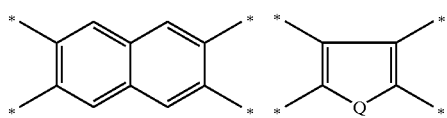
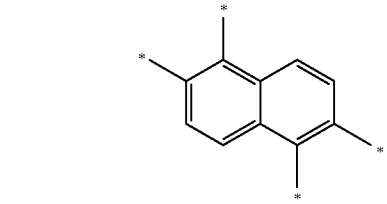
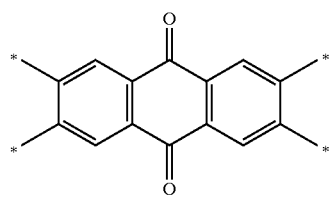
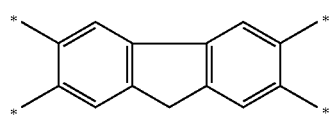
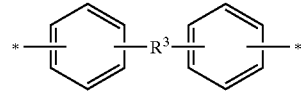
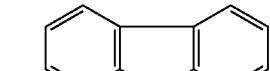
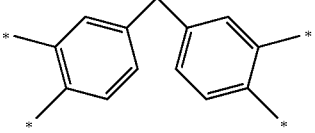
-continued
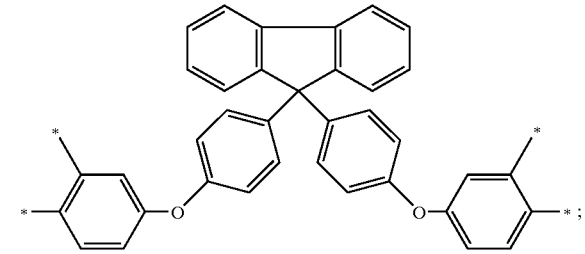
A, if at least one of a=0 and d=1, is a substituent selected from the group consisting of:
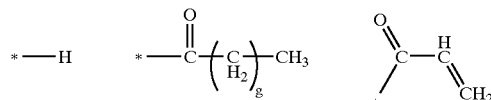
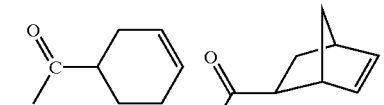
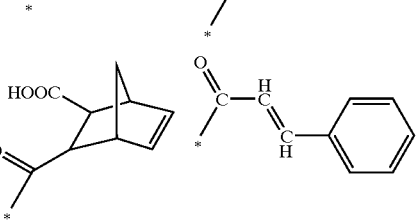
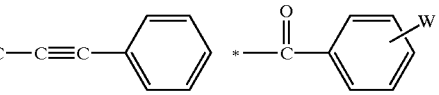
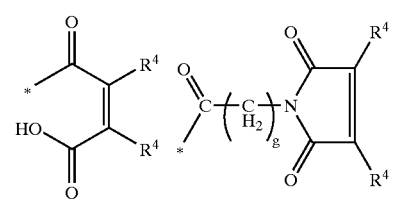
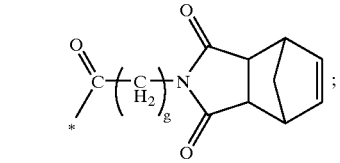
A, if at least one of a=1 and d=0, is a substituent selected from the group consisting of:
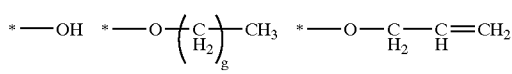

31
-continued
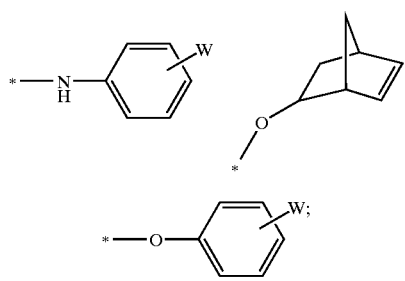
E is a substituent selected from the group consisting of:
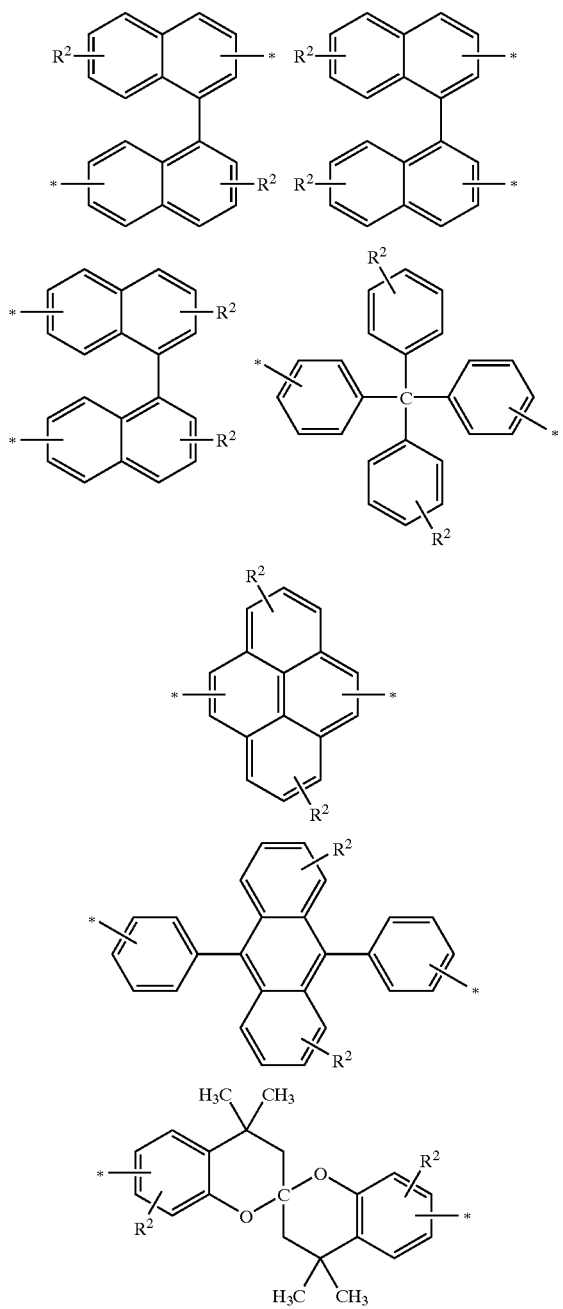
32
-continued
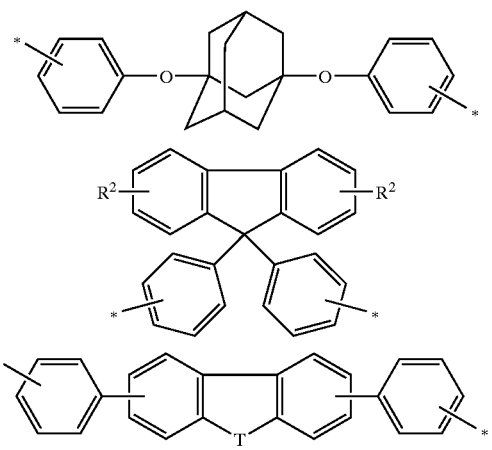
W is a substituent selected from the group consisting of:
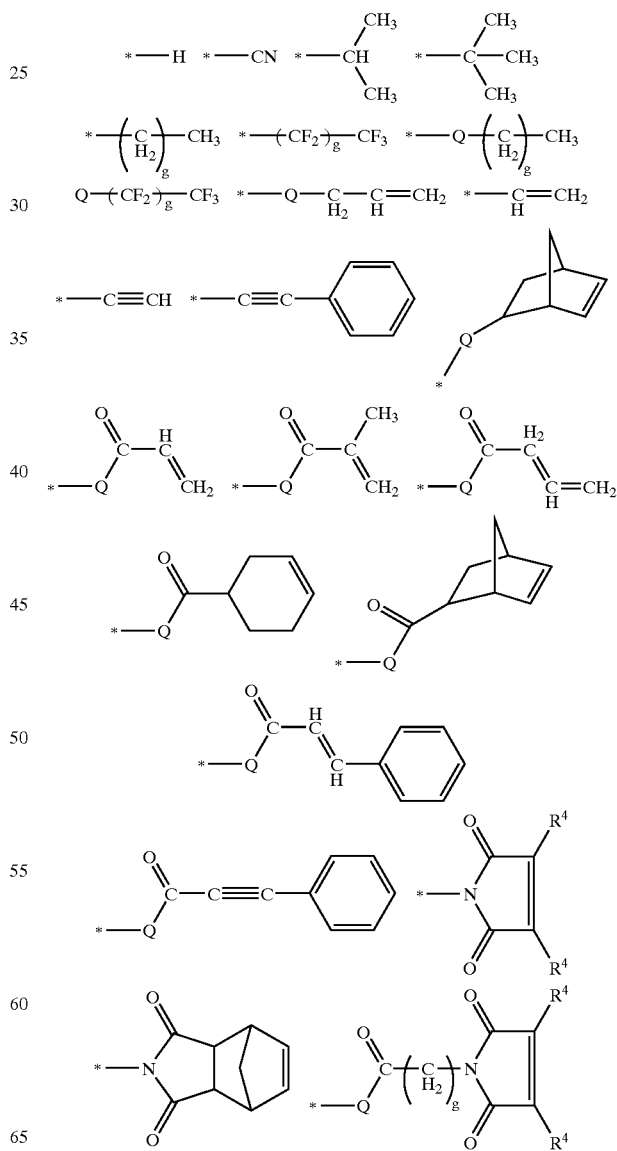

-continued
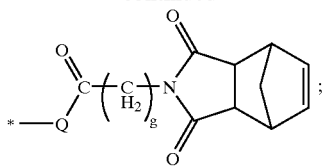
T is a substituent selected from the group consisting of:
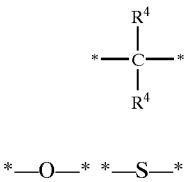
Q is
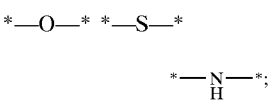
$R^1$ is a substituent selected from the group consisting of:
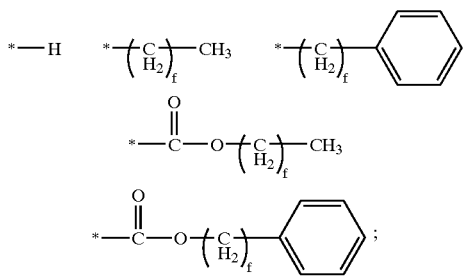
$R^2$ is a substituent selected from the group consisting of —H, —CF$_3$, —OH, —SH, —COOH, —N(R$^5$)$_2$, an alkyl group, an aryl group, a heteroaryl group and
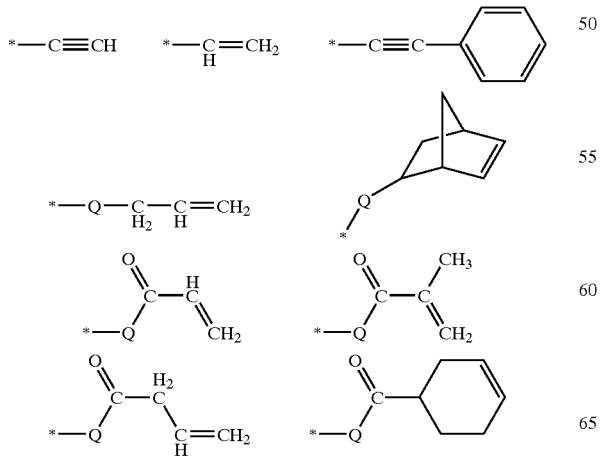
-continued
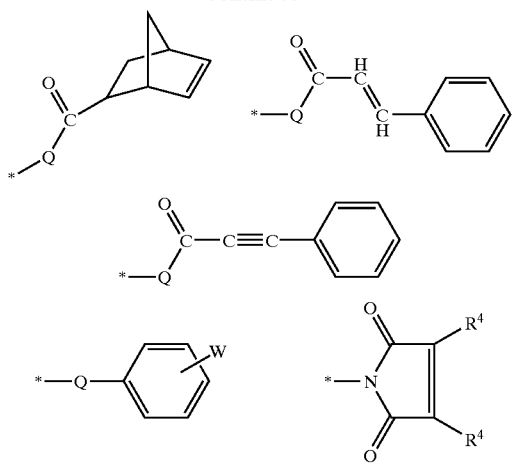
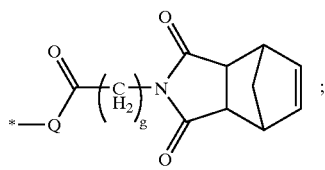
$R^3$ is a substituent selected from the group consisting of:
*—O—*
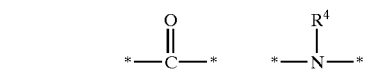
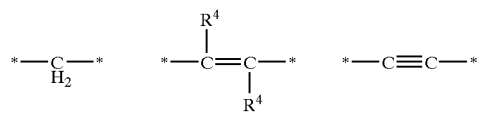
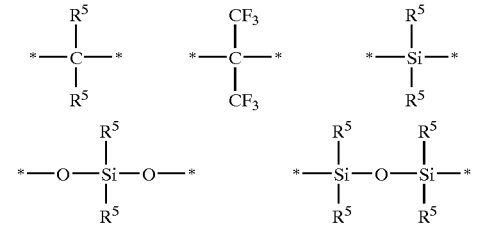

-continued

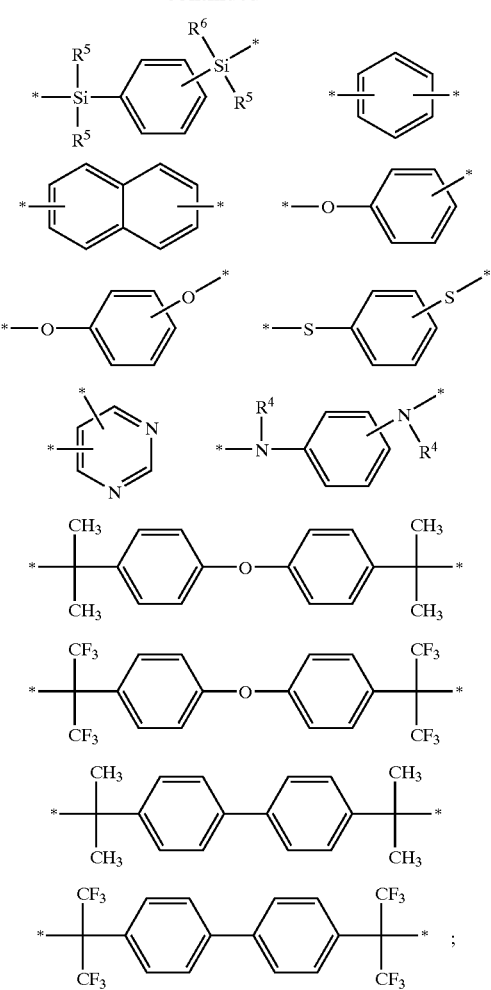

$R^4$ is a substituent selected from the group consisting of:

*—H

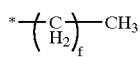

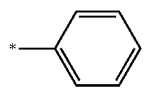   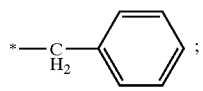 ;

$R^5$ is a substituent selected from the group consisting of an alkyl, an aryl, and a heteroaryl radical;

a is an integer from 0 to 1;

b is an integer from 1 to 200;

c is an integer from 0 10 200;

d is an integer from 0 to 1;

e is an integer from 0 to 10;

f is an integer from 0 to 10;

g is an integer from 0 to 10;

h is an integer from 1 to 10;

n is an integer from 0 to 1; and x is an integer from 0 to 10 if $R^3$ is —$CH_2$—.

2. The poly-o-hydroxyamide according to claim 1, wherein b is an integer from 5 to 50.

3. The poly-o-hydroxyamide according to claim 1, wherein c is an integer from 0 to 50.

4. The poly-o-hydroxyamide according to claim 1, wherein n equals 1.

5. The poly-o-hydroxyamide according to claim 1, wherein said hydroxyamide of said formula I includes repeating units, said repeating units being thermally labile and liberating a gas on heating.

6. The poly-o-hydroxyamide according to claim 5, wherein said thermally labile repeating units are formed as a block in said poly-o-hydroxyamide of said formula I.

7. A polybenzoxazole obtained from the poly-o-hydroxyamide according to claim 1.

8. A process for preparing a poly-o-hydroxyamide having a formula I

FORMULA I

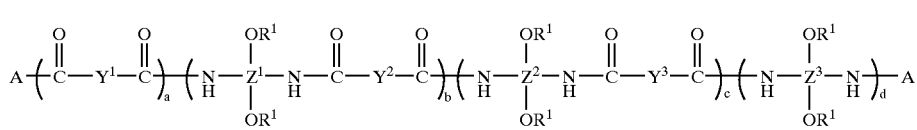

wherein:

$Y^2$ is

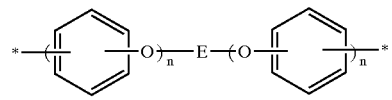

$Y^1$ and $Y^3$, in each case independently of one another, are a substituent selected from the group consisting of:

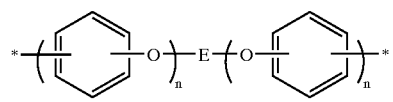

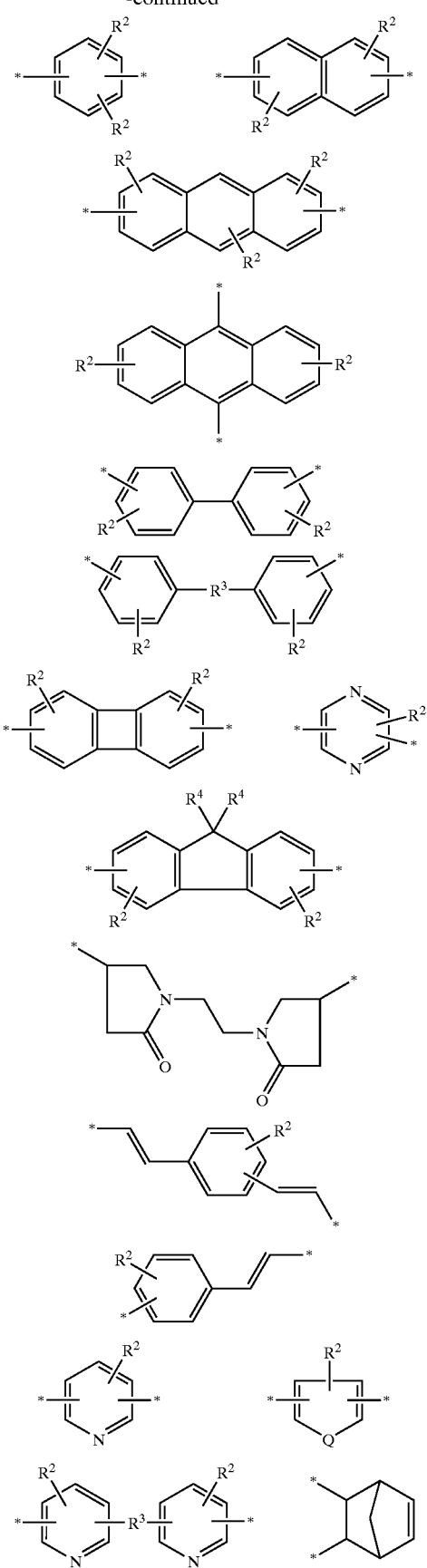
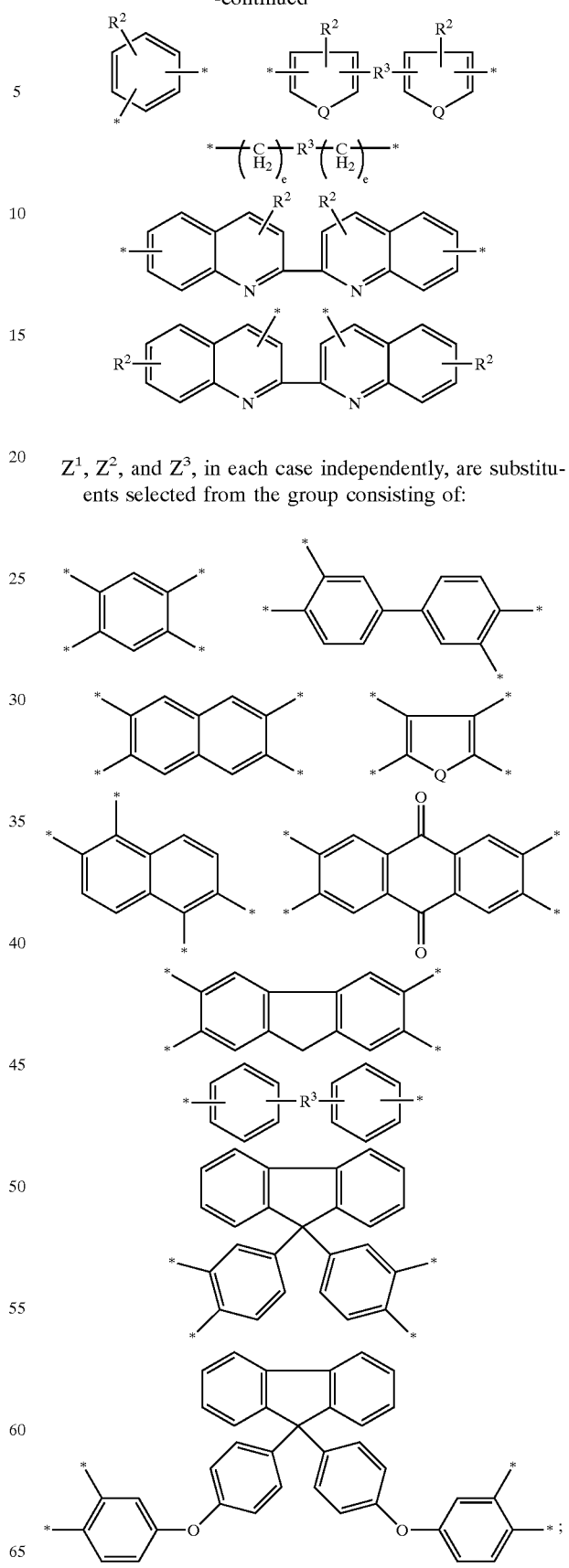
$Z^1$, $Z^2$, and $Z^3$, in each case independently, are substituents selected from the group consisting of:

A, if at least one of a=0 and d=1, is a substituent selected from the group consisting of:
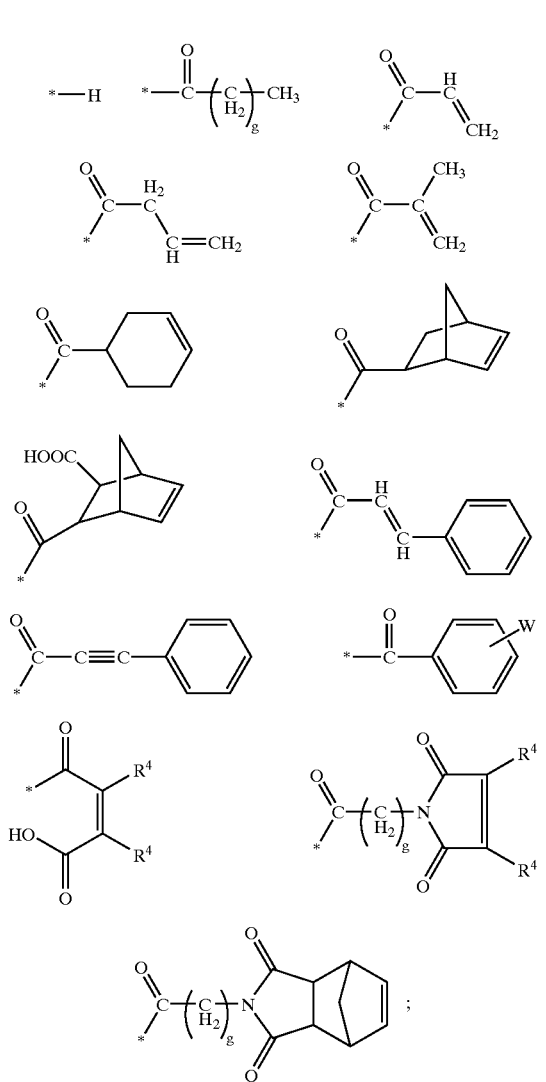
A, if at least one of a=1 and d=0, is a substituent selected from the group consisting of:
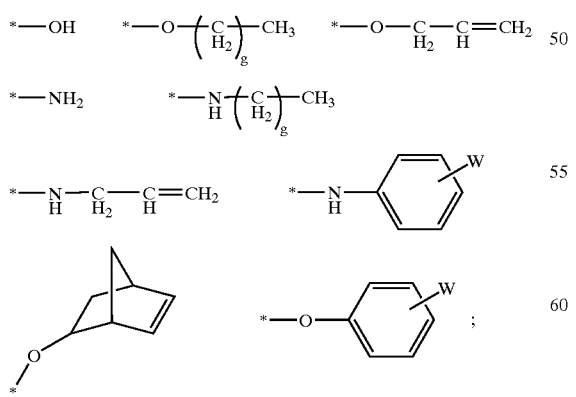
E is a substituent selected from the group consisting of:
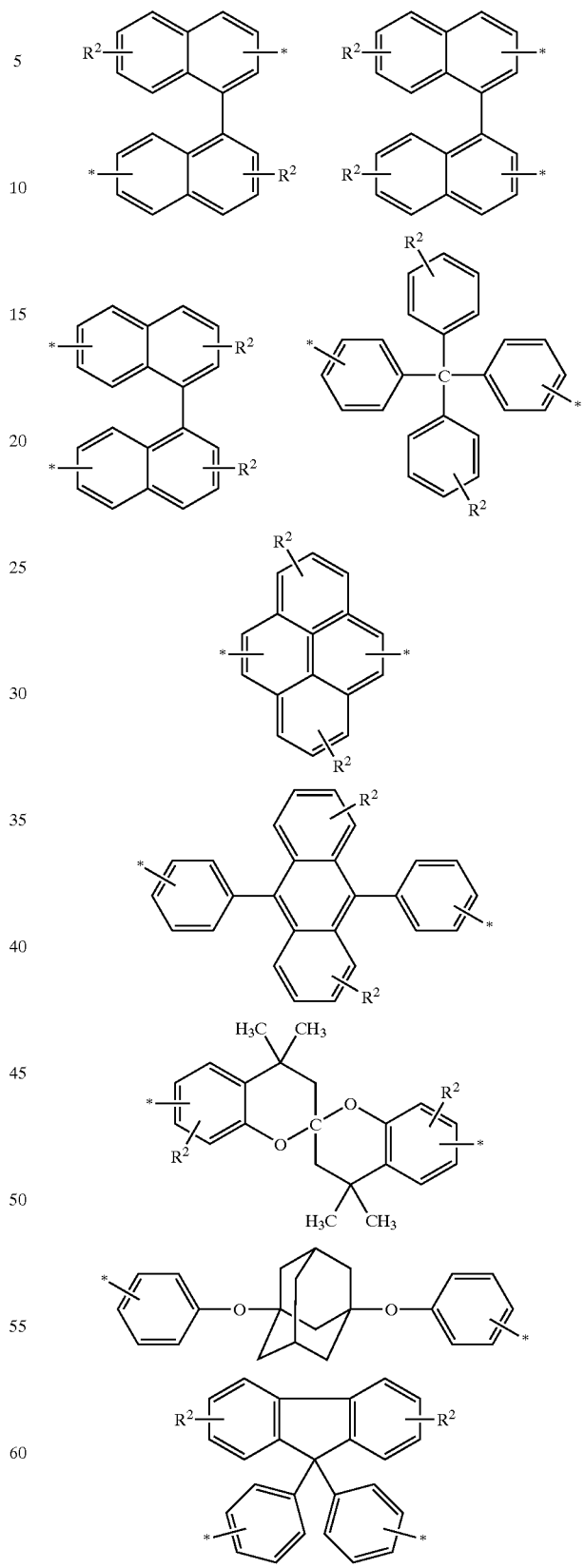

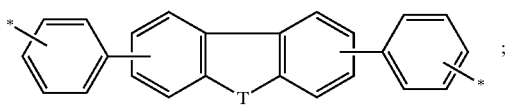
W is a substituent selected from the group consisting of:
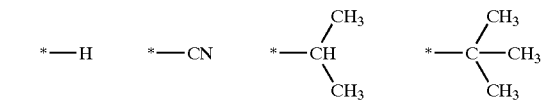
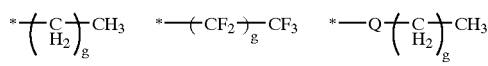
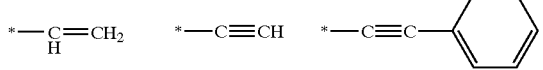
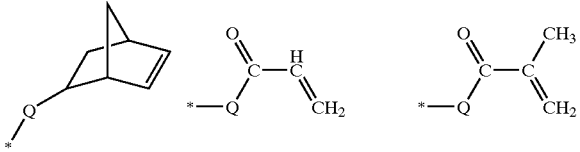
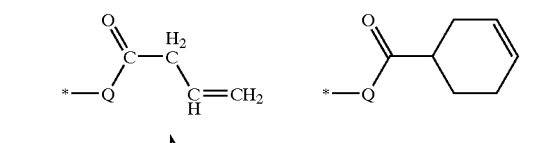
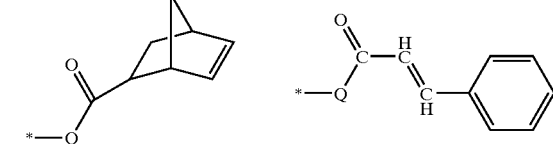
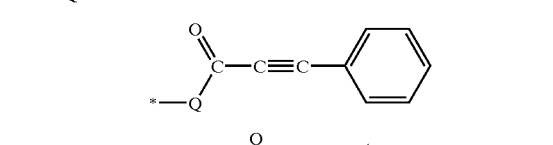
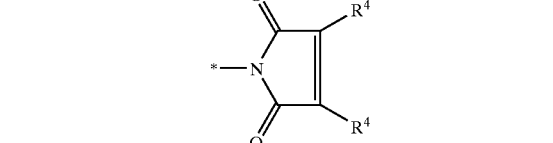
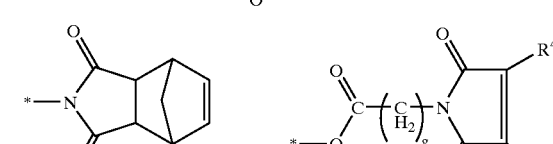
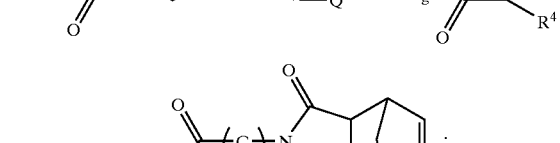
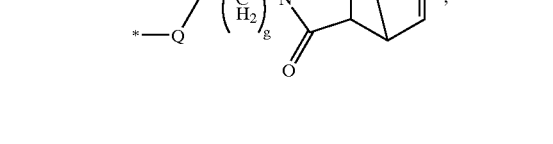
T is a substituent selected from the group consisting of:
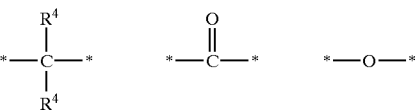
Q is
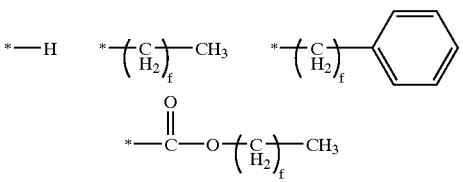
$R^1$ is a substituent selected from the group consisting of:
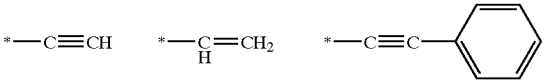
$R^2$ is a substituent selected from the group consisting of —H, —$CF_3$, —OH, —SH, —COOH, —$N(R^5)_2$, an alkyl group, an aryl group, a heteroaryl group and

R³ is a substituent selected from the group consisting of:

[chemical structures]

R⁴ is a substituent selected from the group consisting of:

[chemical structures]

$R^5$ is a substituent selected from the group consisting of an alkyl, an aryl, and a heteroaryl radical;
a is an integer from 0 to 1;
b is an integer from 1 to 200;
c is an integer from 0 10 200;
d is an integer from 0 to 1;
e is an integer from 0 to 10;
f is an integer from 0 to 10;
g is an integer from 0 to 10;
h is an integer from 1 to 10;
n is an integer from 0 to 1; and
x is an integer from 0 to 10 if $R^3$ is —CH₂—;
the process which comprises:
   providing a monomer having a formula II $$H_2N-\underset{\underset{OR^1}{|}}{\overset{\overset{OR^1}{|}}{Z}}-NH_2;$$ Formula II reacting the monomer with at least one of a dicarboxylic acid and an activated dicarboxylic acid derivative having a formula III $$\underset{L}{\overset{O}{\parallel}}{C}-Y-\underset{L}{\overset{O}{\parallel}}{C}$$ Formula III wherein:
   L is selected from the group consisting of a hydroxyl group and an activating group, and
   Y is selected from the group consisting of $Y^1$, $Y^2$, and $Y^3$.

9. The process according to claim 8, which further comprises including a base during the reacting step.

10. A process for preparing a polybenzoxazole, which comprises heating a poly-o-hydroxyamides having a formula I FORMULA I
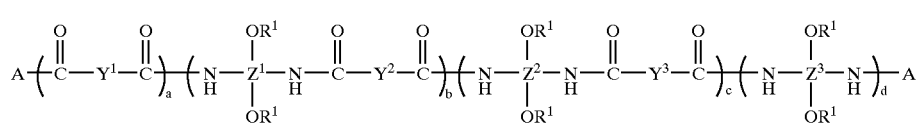
wherein:
$Y^2$ is
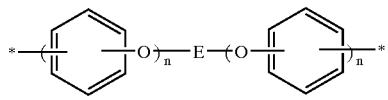
$Y^1$ and $Y^3$, in each case independently of one another, are a substituent selected from the group consisting of:
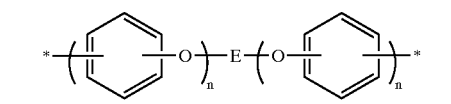
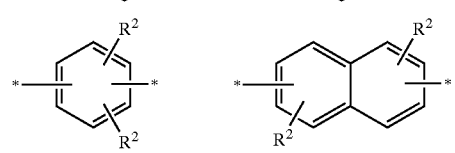
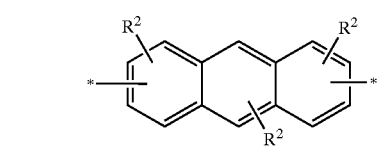
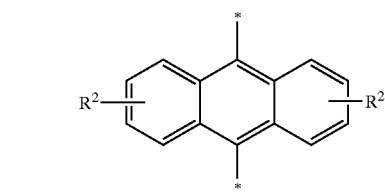
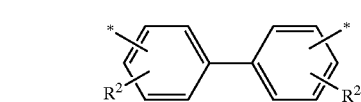
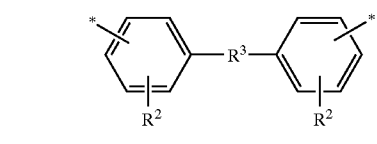
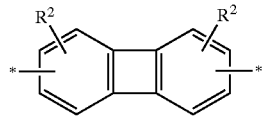
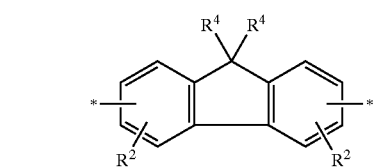
-continued
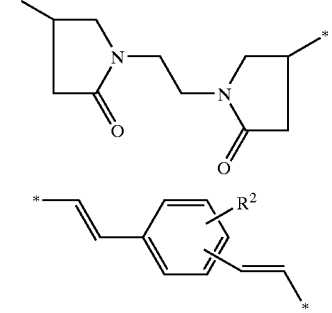
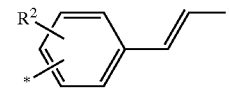
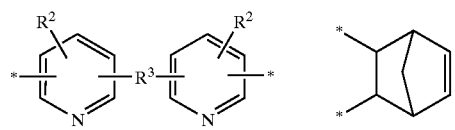
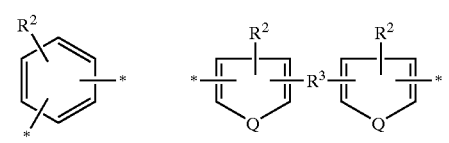
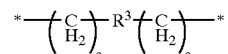
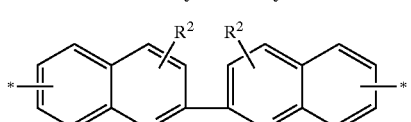
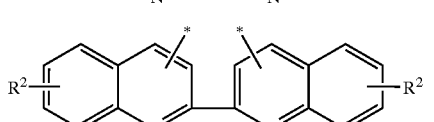
$Z^1$, $Z^2$, and $Z^3$, in each case independently, are substituents selected from the group consisting of:
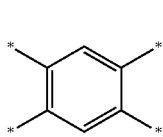 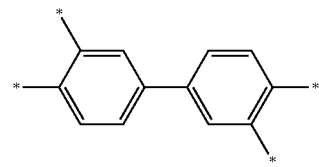

-continued
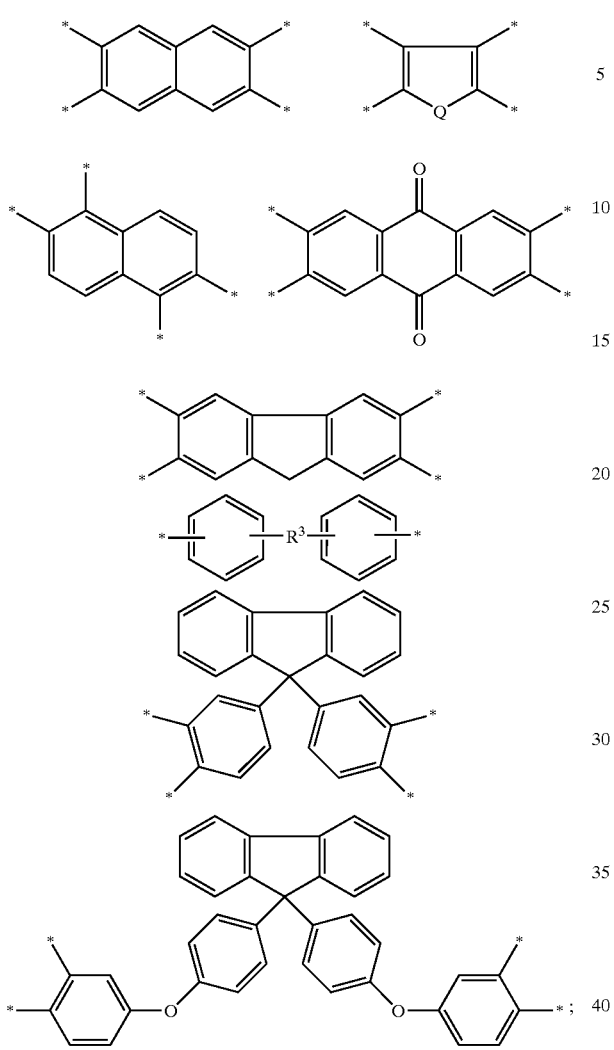
A, if at least one of a=0 and d=1, is a substituent selected from the group consisting of:
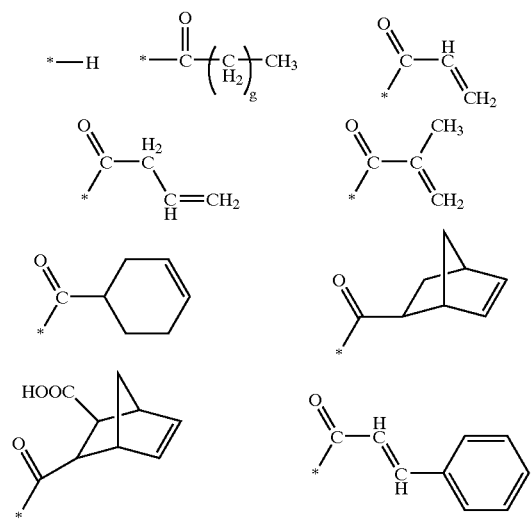
-continued
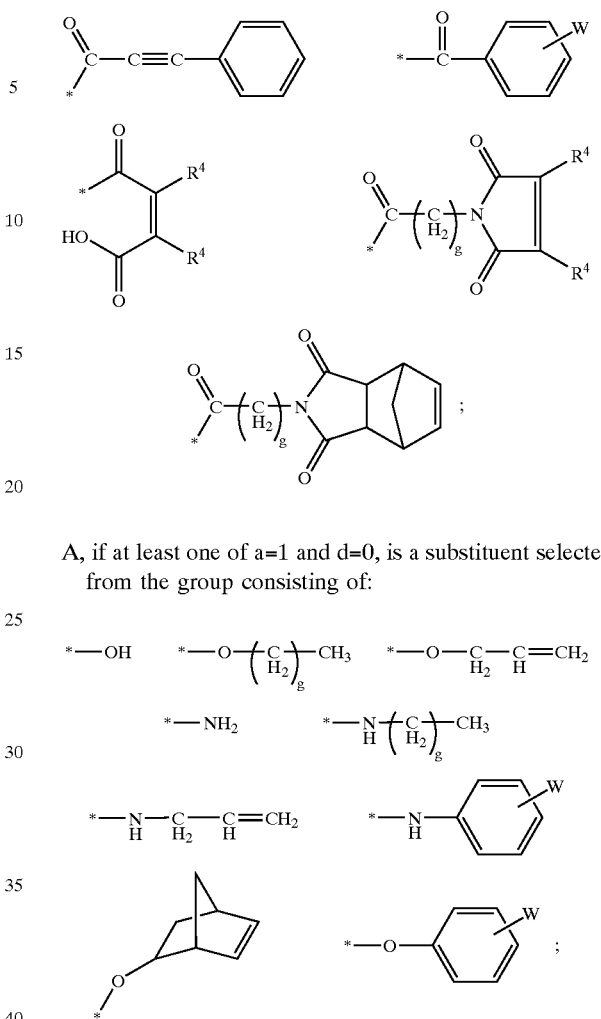
A, if at least one of a=1 and d=0, is a substituent selected from the group consisting of:
E is a substituent selected from the group consisting of:
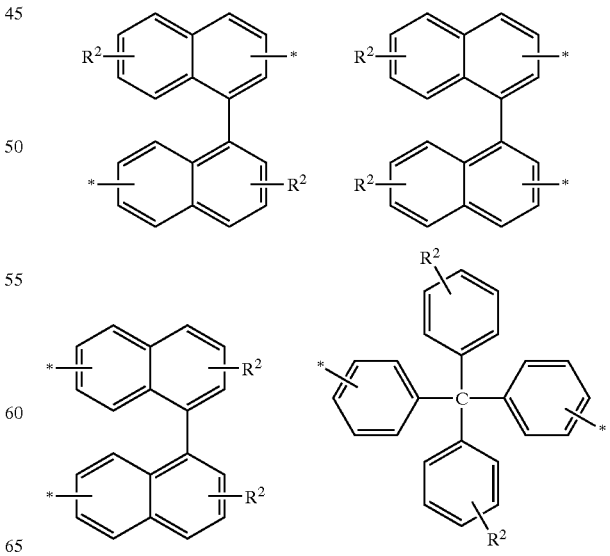

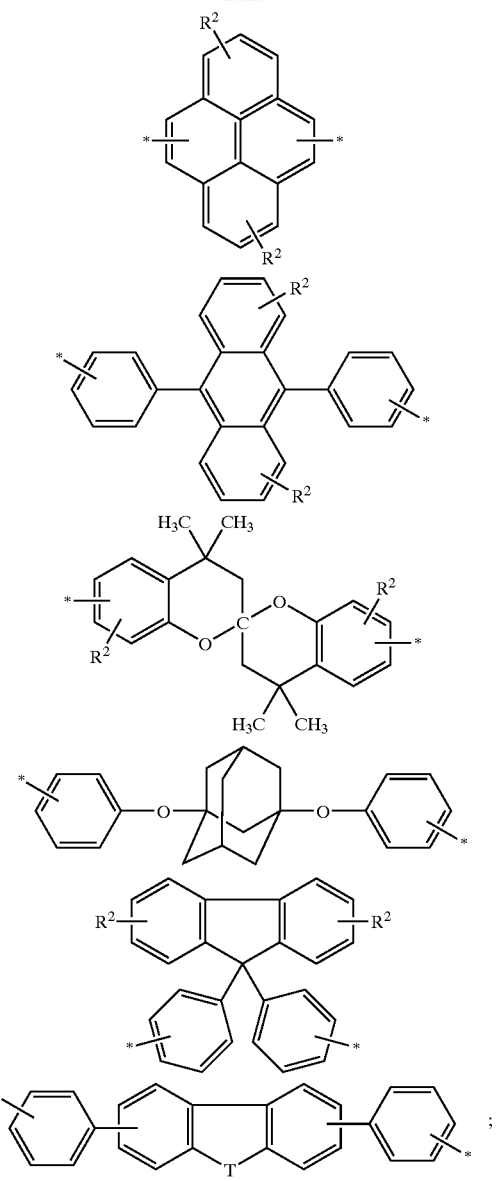
W is a substituent selected from the group consisting of:
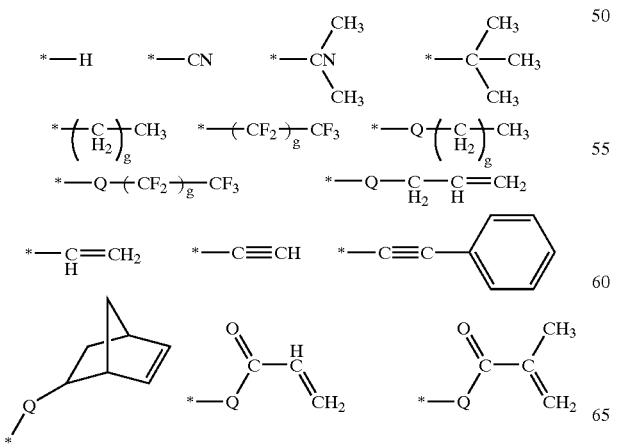
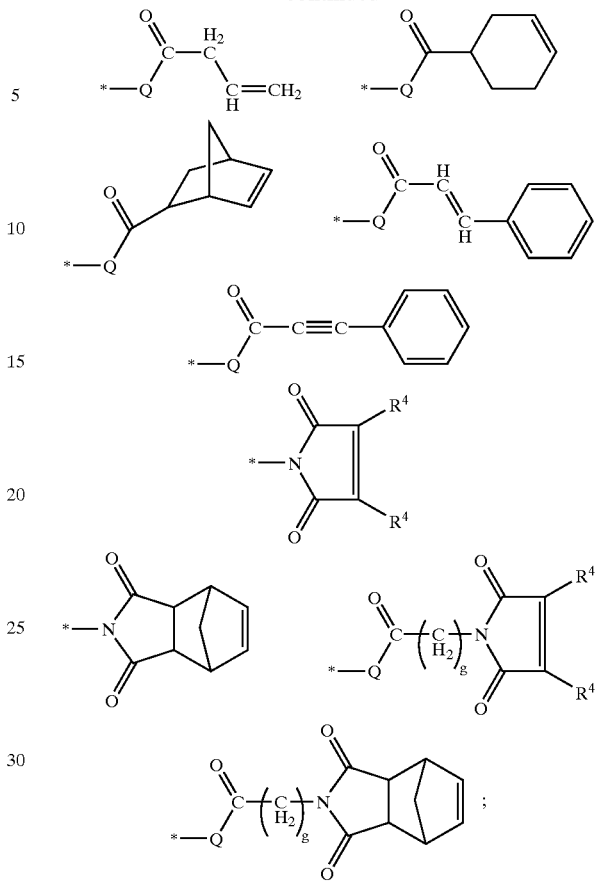
T is a substituent selected from the group consisting of:
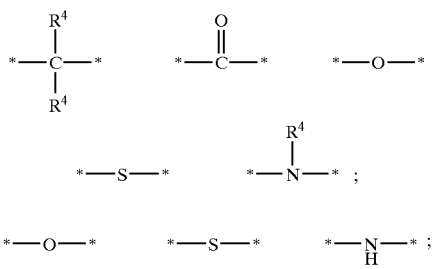
Q is
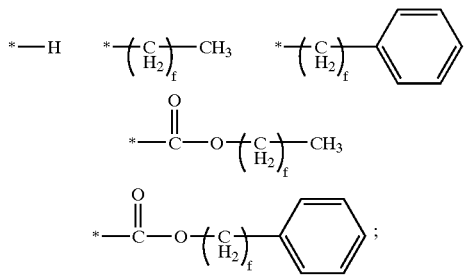
$R^1$ is a substituent selected from the group consisting of:
R² is a substituent selected from the group consisting of —H, —CF₃, —OH, —SH, —COOH, —N(R⁵)₂, an alkyl group, an aryl group, a heteroaryl group and

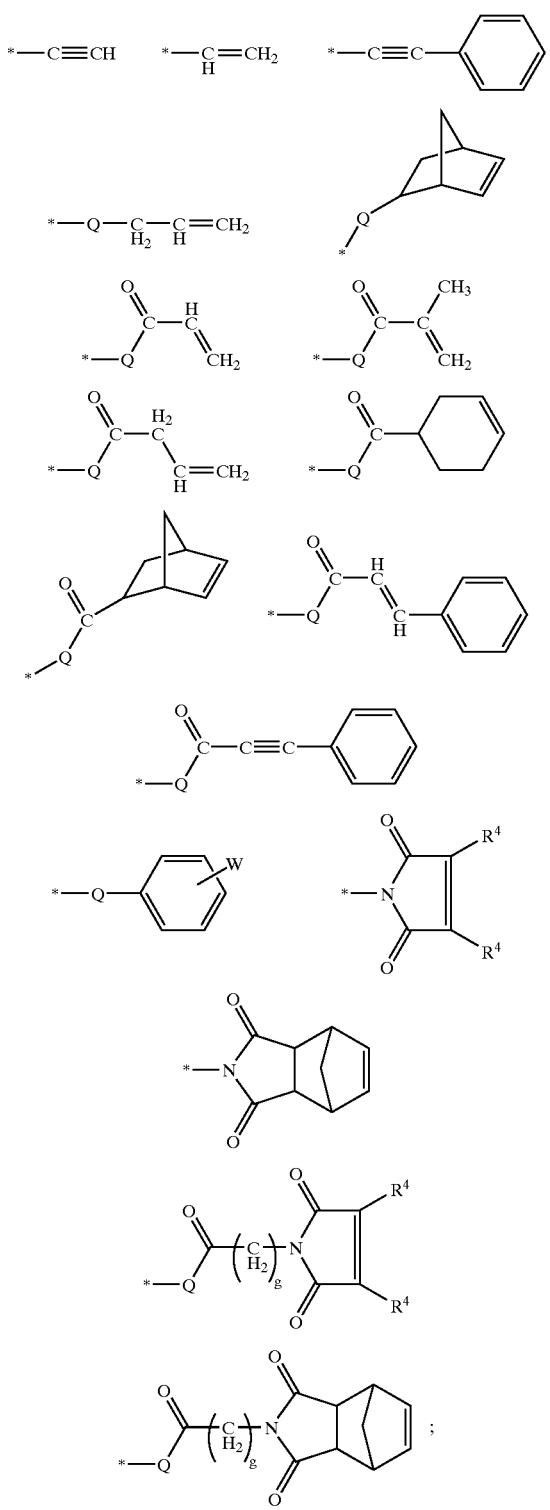
R³ is a substituent selected from the group consisting of:
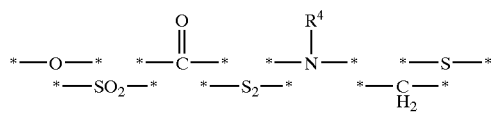
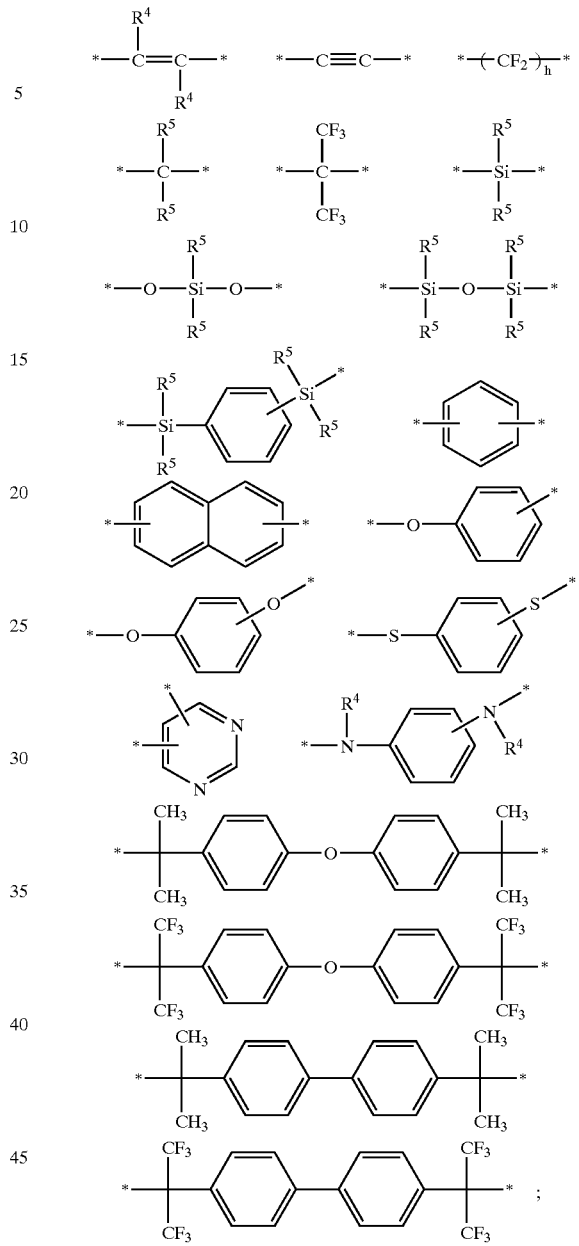
R⁴ is a substituent selected from the group consisting of:
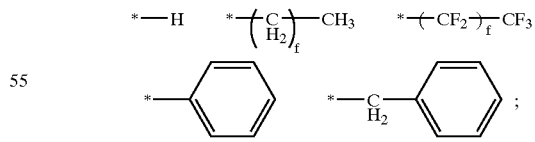
R⁵ is a substituent selected from the group consisting of an alkyl, an aryl, and a heteroaryl radical;
a is an integer from 0 to 1;
b is an integer from 1 to 200;
c is an integer from 0 10 200;
d is an integer from 0 to 1;
e is an integer from 0 to 10;
f is an integer from 0 to 10;

g is an integer from 0 to 10;
h is an integer from 1 to 10;
n is an integer from 0 to 1; and
x is an integer from 0 to 10 if $R^3$ is —$CH_2$—.

11. An electronic component, comprising a dielectric including a polybenzoxazole according to claim 7.

12. A process for producing an electronic component including a dielectric made of a polybenzoxazole, which comprises:

preparing a solution of a poly-o-hydroxyamide having a formula I in a solvent;

FORMULA I

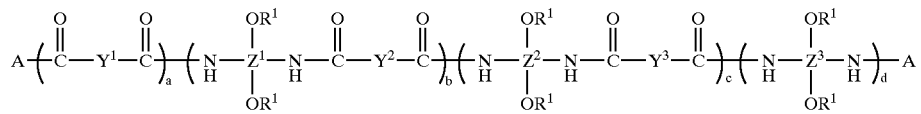

wherein:

$Y^2$ is

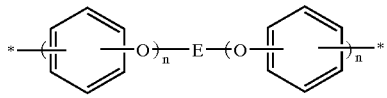

$Y^1$ and $Y^3$, in each case independently of one another, are a substituent selected from the group consisting of:

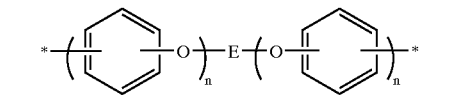

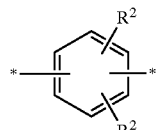 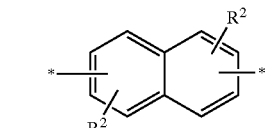

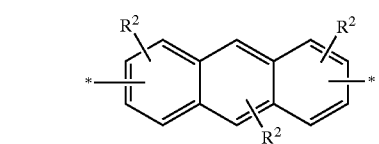

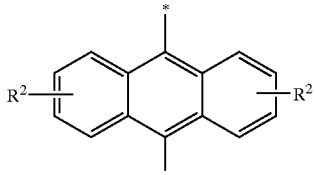

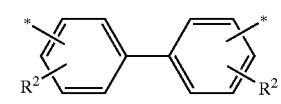

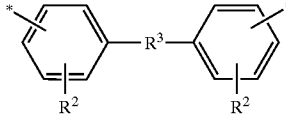

-continued

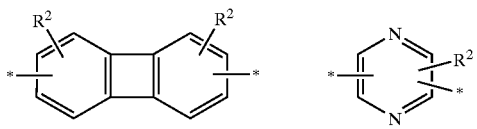

-continued

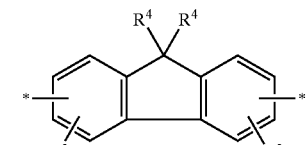

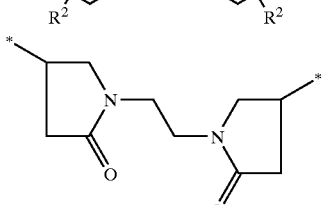

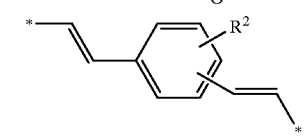

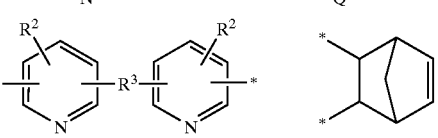

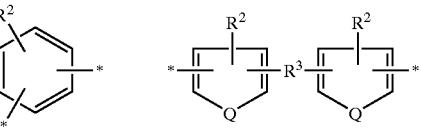

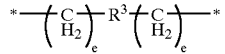

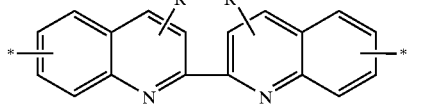

-continued
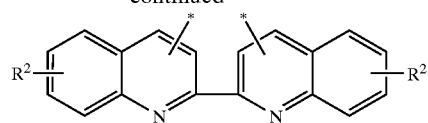
$Z^1$, $Z^2$, and $Z^3$, in each case independently, are substituents selected from the group consisting of:
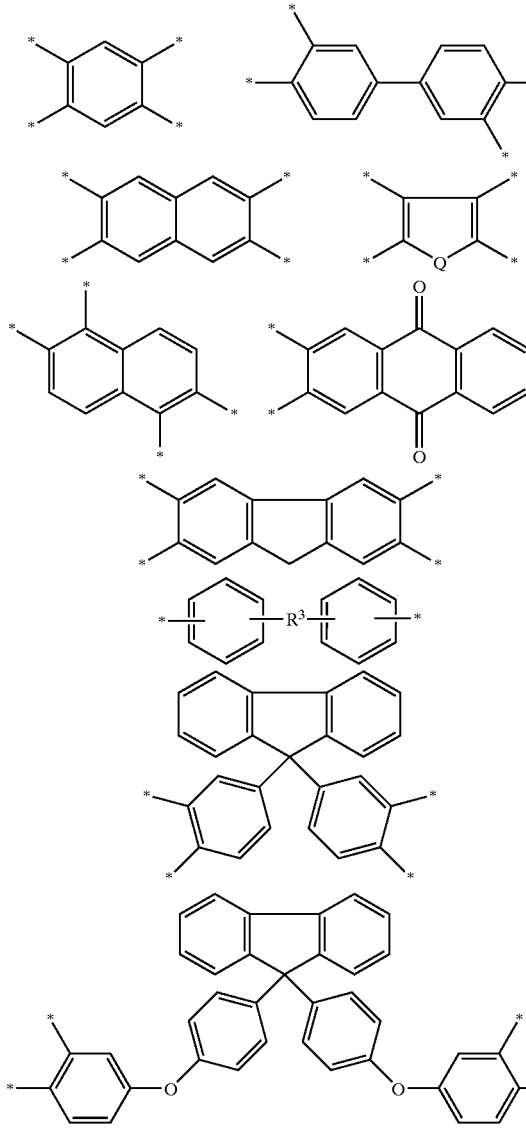
A, if at least one of a=0 and d=1, is a substituent selected from the group consisting of:
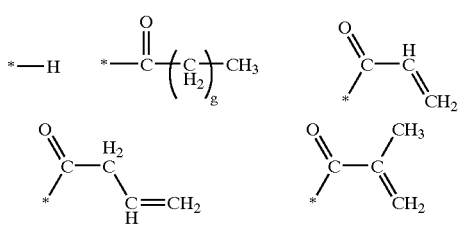
-continued
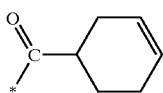 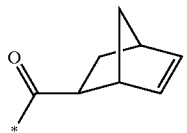
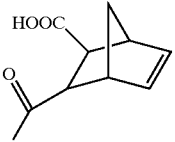 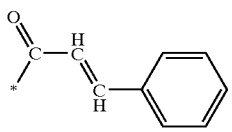
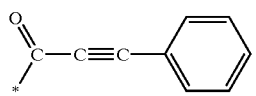
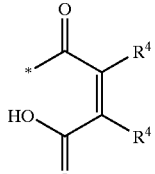 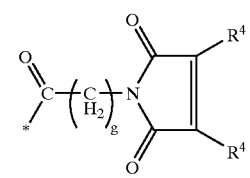
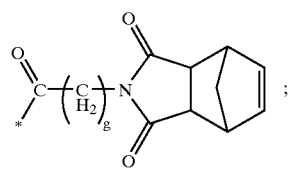
A, if at least one of a=1 and d=0, is a substituent selected from the group consisting of:
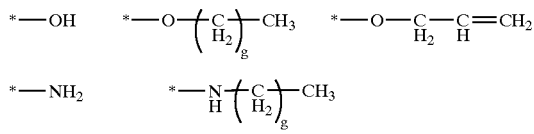
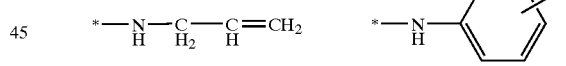
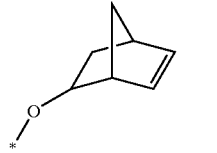 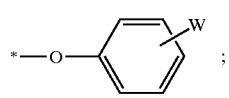
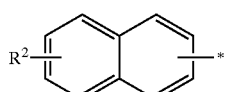 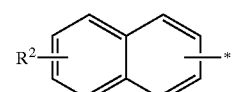
E is a substituent selected from the group consisting of:
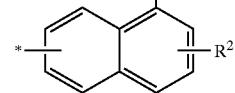 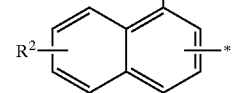

-continued
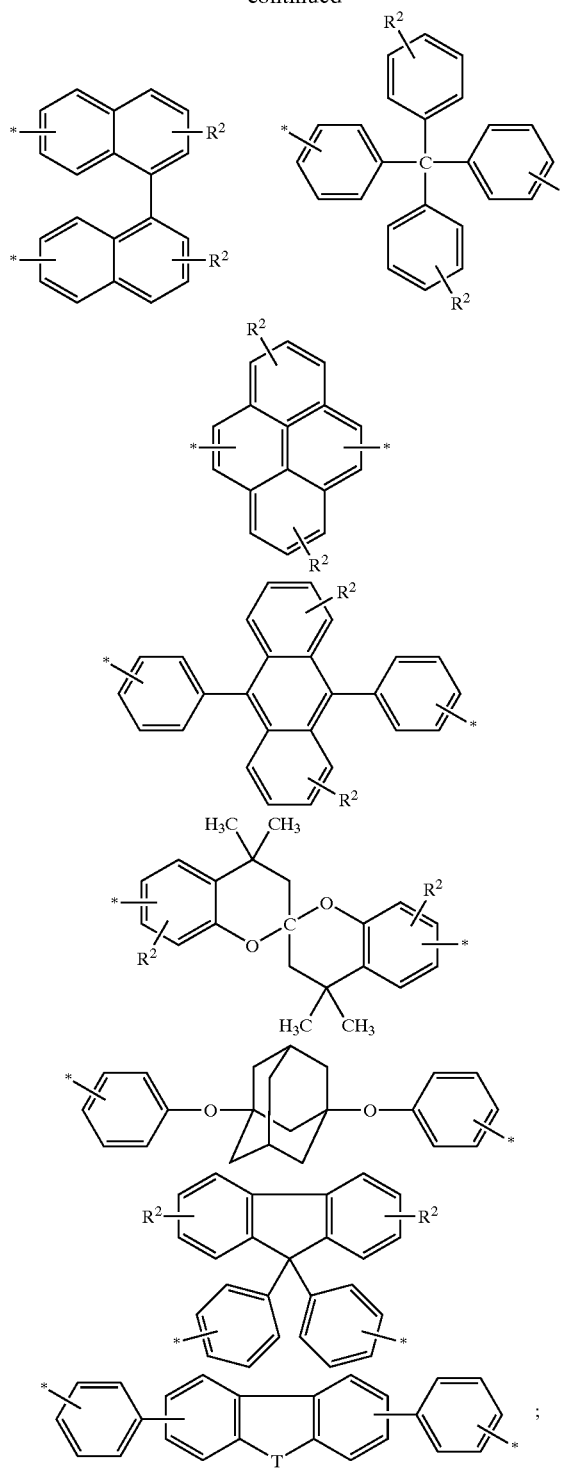
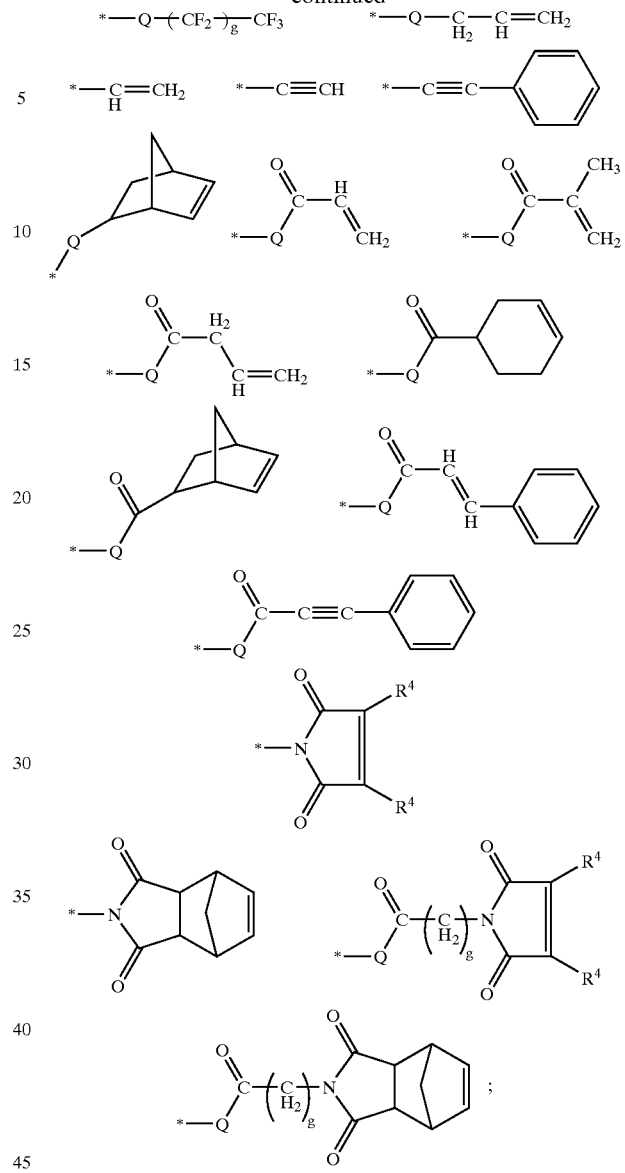
T is a substituent selected from the group consisting of:
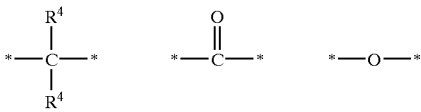
Q is
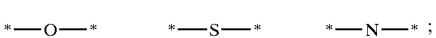
W is a substituent selected from the group consisting of:
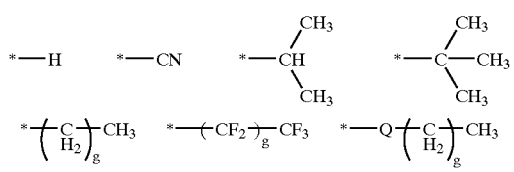
$R^1$ is a substituent selected from the group consisting of:
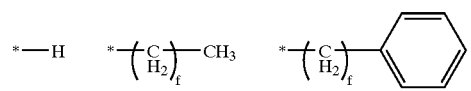

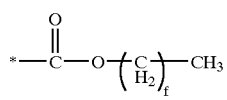
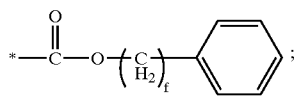
R² is a substituent selected from the group consisting of —H, —CF₃, —OH, —SH, —COOH, —N(R⁵)₂, an alkyl group, an aryl group, a heteroaryl group and
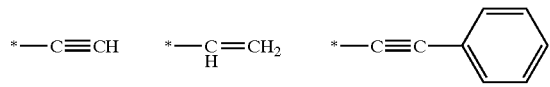
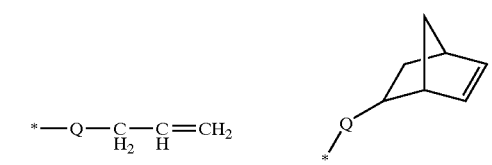
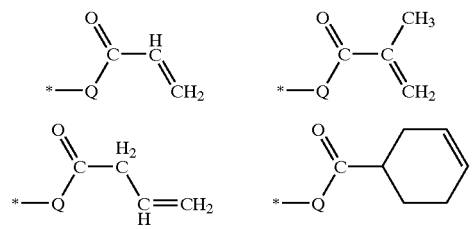
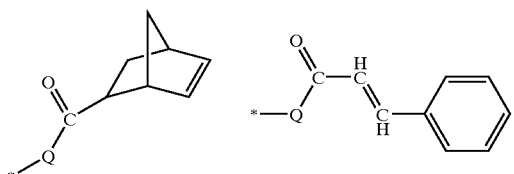
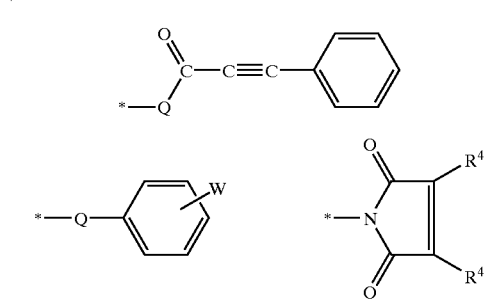
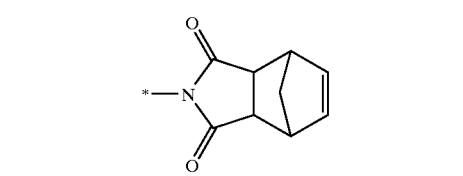
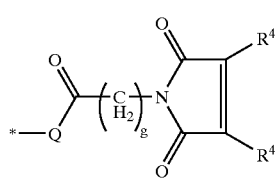
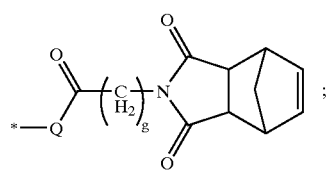
R³ is a substituent selected from the group consisting of:
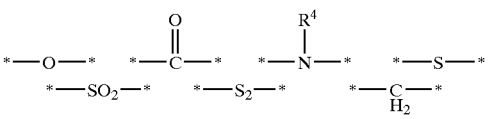
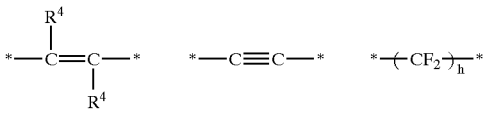
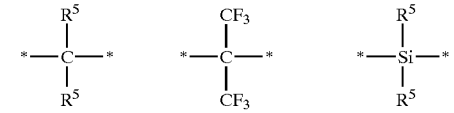
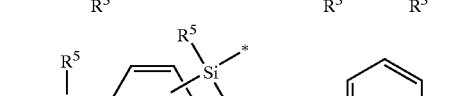
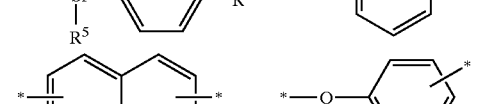
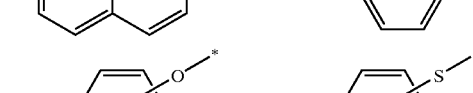
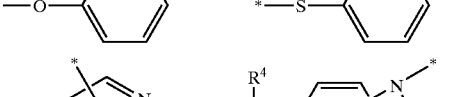
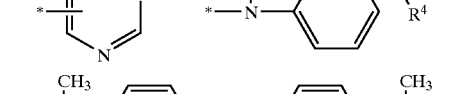
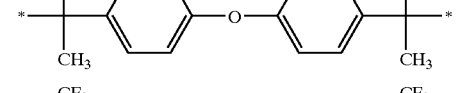

$R^4$ is a substituent selected from the group consisting of:

*—H   *—(CH$_2$)$_f$—CH$_3$   *—(CF$_2$)$_f$—CF$_3$

*—C$_6$H$_5$   *—CH$_2$—C$_6$H$_5$ ;

$R^5$ is a substituent selected from the group consisting of an alkyl, an aryl, and a heteroaryl radical;
a is an integer from 0 to 1;
b is an integer from 1 to 200;
c is an integer from 0 10 200;
d is an integer from 0 to 1;
e is an integer from 0 to 10;
f is an integer from 0 to 10;
g is an integer from 0 to 10;
h is an integer from 1 to 10;
n is an integer from 0 to 1; and
x is an integer from 0 to 10 if $R^3$ is —CH$_2$—;
applying the solution to a substrate;
evaporating the solvent to obtain a film;
heating the film to cyclize the poly-o-hydroxyamide of the formula I to give the polybenzoxazole according claim 7;
structuring the film to obtain a resist structure having trenches and contact holes formed therein;
depositing a conductive material on the resist structure to fill the trenches and the contact holes with the conductive material; and
removing an excess of the conductive material.

13. A process for producing an electronic component, which comprises:
preparing a solution of a poly-o-hydroxyamide having a formula I in a solvent;

FORMULA I $$A\!-\!\!\left(\!\!\begin{array}{c}O\\\|\\C\end{array}\!\!-\!Y^1\!-\!\!\begin{array}{c}O\\\|\\C\end{array}\!\!\right)_{\!a}\!\!\left(\!\!\begin{array}{c}\\N\\|\\H\end{array}\!\!-\!\!\begin{array}{c}OR^1\\|\\Z^1\\|\\OR^1\end{array}\!\!-\!\!\begin{array}{c}\\N\\|\\H\end{array}\!\!-\!\!\begin{array}{c}O\\\|\\C\end{array}\!\!-\!Y^2\!-\!\!\begin{array}{c}O\\\|\\C\end{array}\!\!\right)_{\!b}\!\!\left(\!\!\begin{array}{c}\\N\\|\\H\end{array}\!\!-\!\!\begin{array}{c}OR^1\\|\\Z^2\\|\\OR^1\end{array}\!\!-\!\!\begin{array}{c}\\N\\|\\H\end{array}\!\!-\!\!\begin{array}{c}O\\\|\\C\end{array}\!\!-\!Y^3\!-\!\!\begin{array}{c}O\\\|\\C\end{array}\!\!\right)_{\!c}\!\!\left(\!\!\begin{array}{c}\\N\\|\\H\end{array}\!\!-\!\!\begin{array}{c}OR^1\\|\\Z^3\\|\\OR^1\end{array}\!\!-\!\!\begin{array}{c}\\N\\|\\H\end{array}\!\!\right)_{\!d}\!\!-\!A$$

wherein:

$Y^2$ is

*—(C$_6$H$_4$—O)$_n$—E—(O—C$_6$H$_4$)$_n$—*

$Y^1$ and $Y^3$, in each case independently of one another, are a substituent selected from the group consisting of:

*—(C$_6$H$_4$—O)$_n$—E—(O—C$_6$H$_4$)$_n$—*

-continued
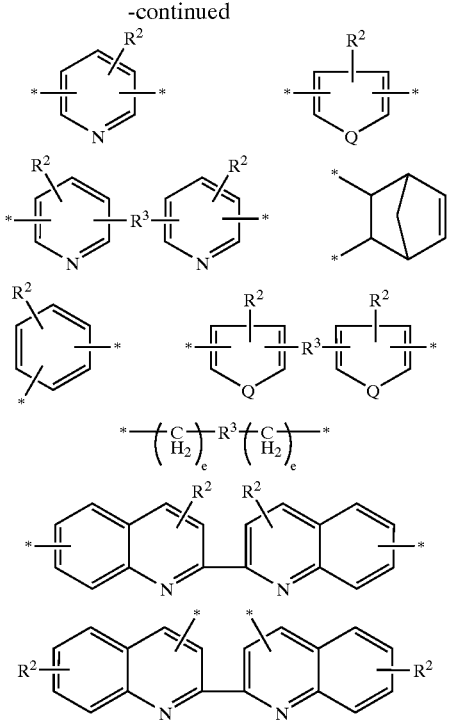
$Z^1$, $Z^2$, and $Z^3$, in each case independently, are substituents selected from the group consisting of:
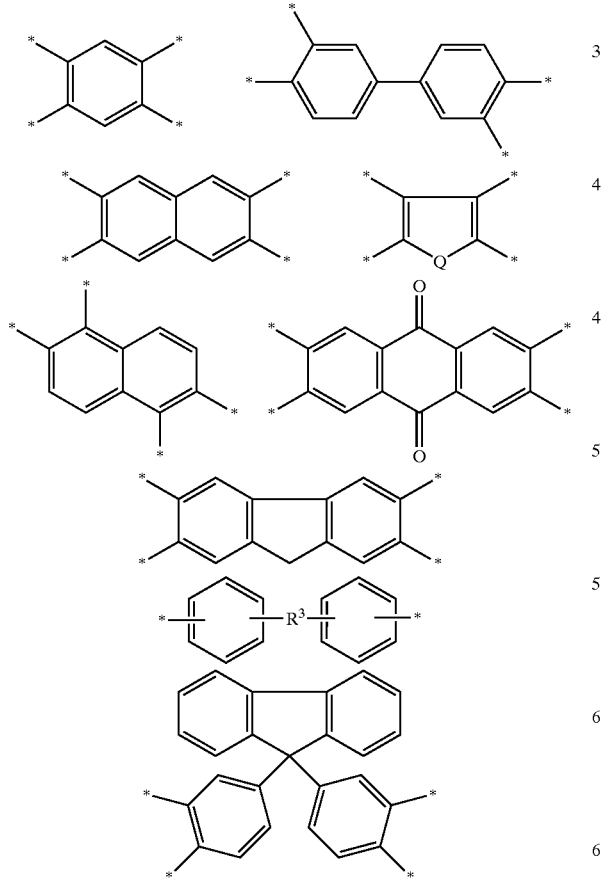
-continued
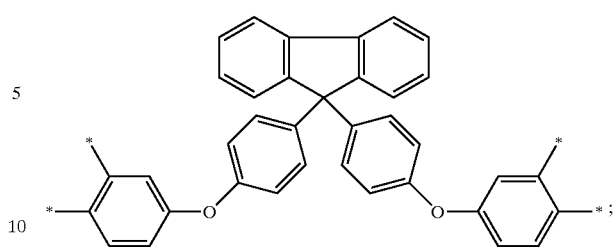
A, if at least one of a=0 and d=1, is a substituent selected from the group consisting of:
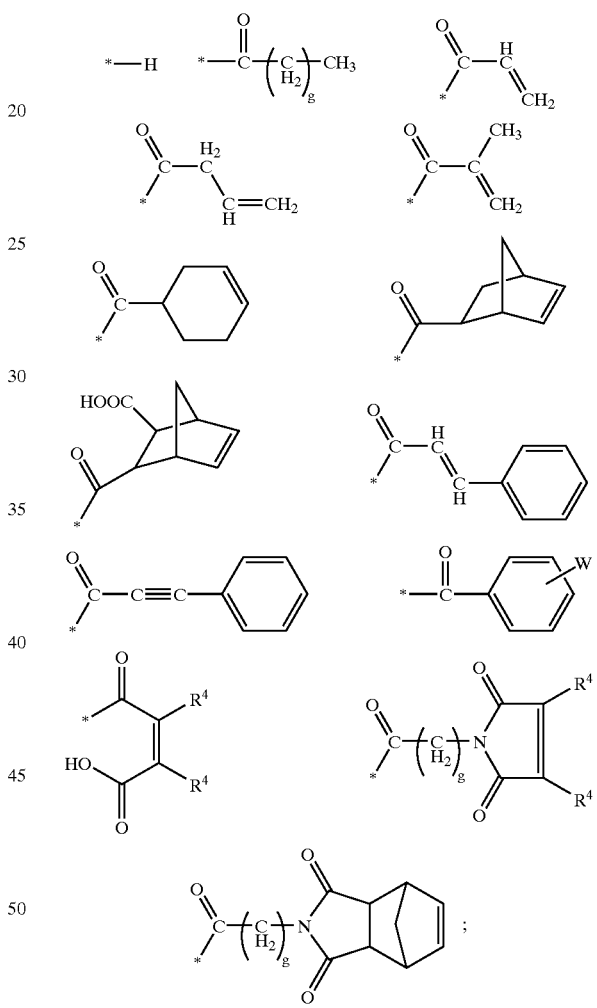
A, if at least one of a=1 and d=0, is a substituent selected from the group consisting of:
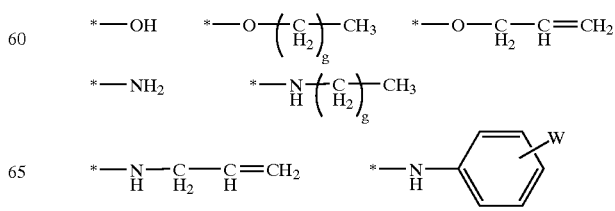

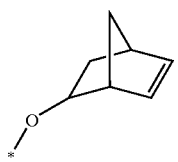 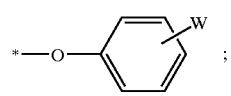
E is a substituent selected from the group consisting of:
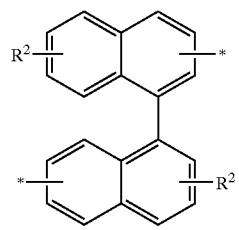 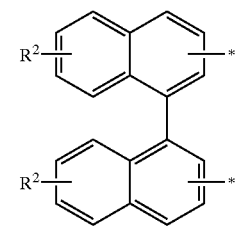
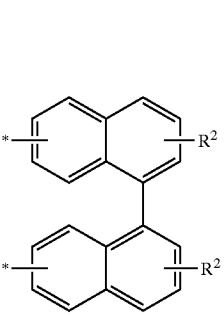 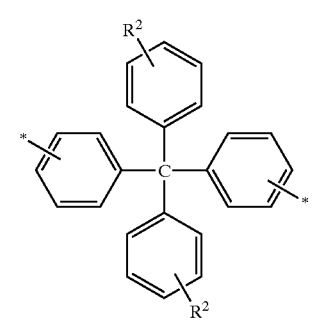
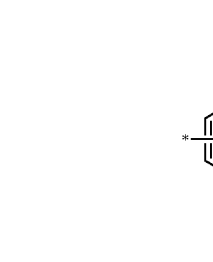
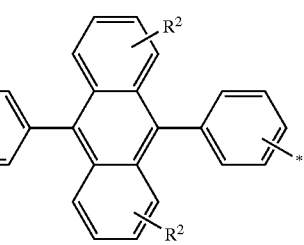
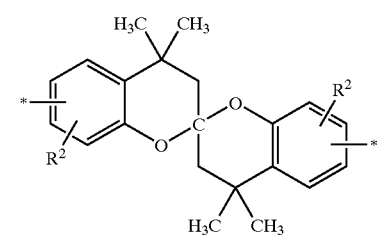
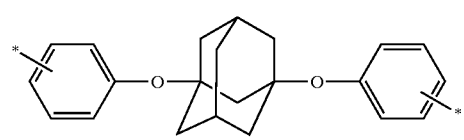
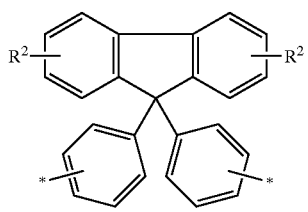
W is a substituent selected from the group consisting of:
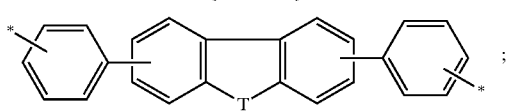
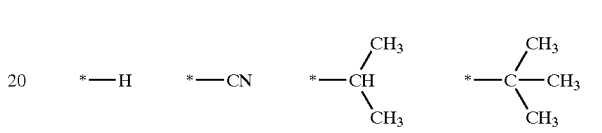
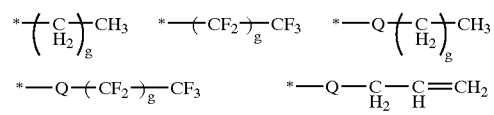
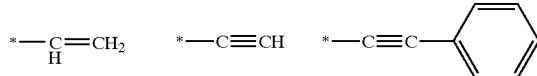
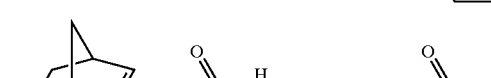
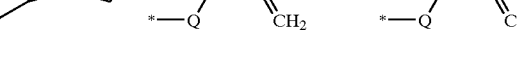
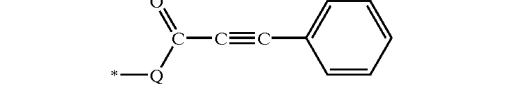
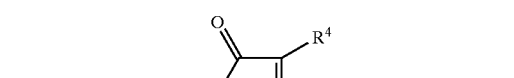
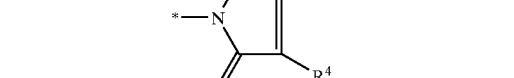
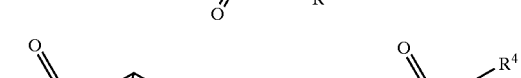
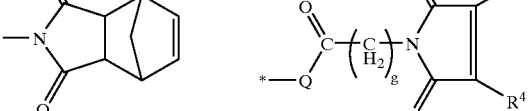

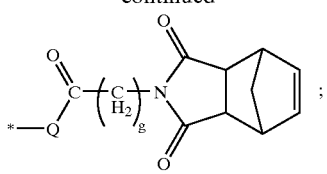
T is a substituent selected from the group consisting of:
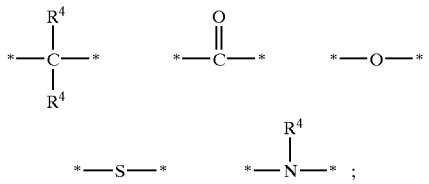
Q is
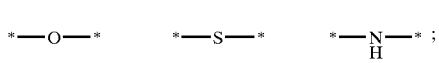
$R^1$ is a substituent selected from the group consisting of:
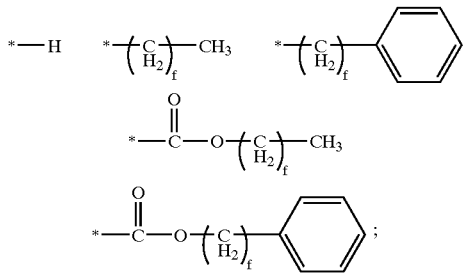
$R^2$ is a substituent selected from the group consisting of —H, —CF$_3$, —OH, —SH, —COOH, —N(R$^5$)$_2$, an alkyl group, an aryl group, a heteroaryl group and
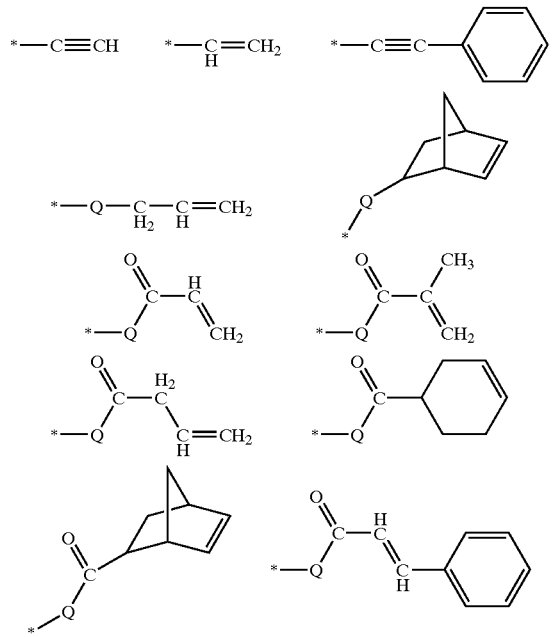
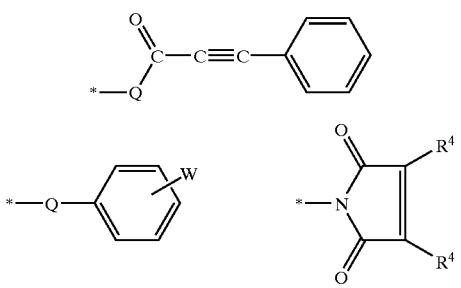
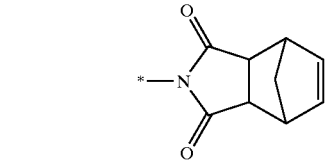
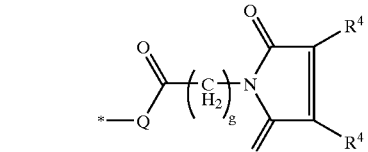
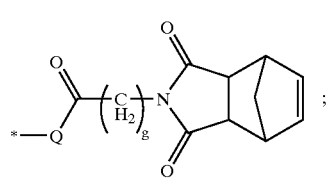
$R^3$ is a substituent selected from the group consisting of:
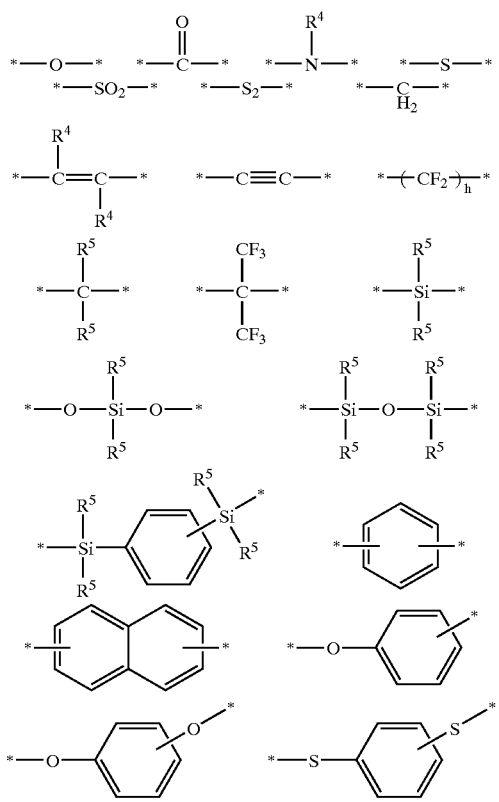

-continued

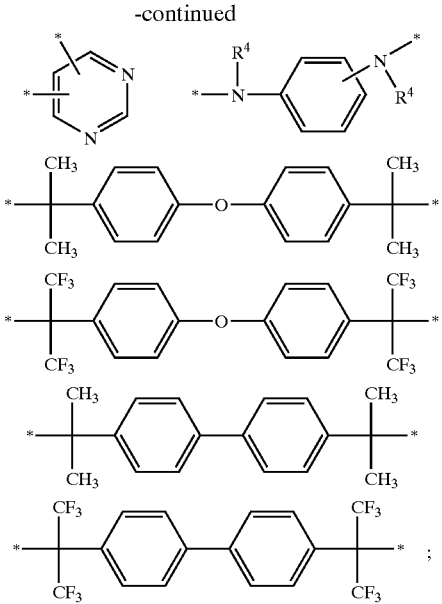

$R^4$ is a substituent selected from the group consisting of:

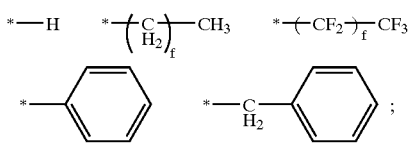

$R^5$ is a substituent selected from the group consisting of an alkyl, an aryl, and a heteroaryl radical;

a is an integer from 0 to 1;

b is an integer from 1 to 200;

c is an integer from 0 10 200;

d is an integer from 0 to 1;

e is an integer from 0 to 10;

f is an integer from 0 to 10;

g is an integer from 0 to 10;

h is an integer from 1 to 10;

n is an integer from 0 to 1; and x is an integer from 0 to 10 if $R^3$ is —$CH_2$— applying the solution to a substrate having a surface with trenches and contact holes formed therein;

disposing metallic structures on the surface; the trenches and contact holes being disposed between the metallic structures;

evaporating the solvent to fill the trenches and contact holes with the poly-o-hydroxyamide of the formula I; and heating the substrate to cyclize the poly-o-hydroxyamide of the formula I to the polybenzoxazole according to claim 6.

14. The process according to claim 12, which further comprises adding a porogen to the solution of the poly-o-hydroxyamide of the formula I.

15. The process according to claim 13, which further comprises adding a porogen to the solution of the poly-o-hydroxyamide of the formula I.

* * * * *